United States Patent [19]

Nobumasa et al.

[11] Patent Number: 5,372,990
[45] Date of Patent: Dec. 13, 1994

[54] OXIDE SUPERCONDUCTOR

[75] Inventors: Hitoshi Nobumasa; Kazuharu Shimizu, both of Otsu, Japan

[73] Assignee: Toray Industries, Ltd., Tokyo, Japan

[21] Appl. No.: 856,964

[22] PCT Filed: Sep. 20, 1991

[86] PCT No.: PCT/JP91/01255
§ 371 Date: May 20, 1992
§ 102(e) Date: May 20, 1992

[87] PCT Pub. No.: WO92/05114
PCT Pub. Date: Apr. 2, 1992

[30] Foreign Application Priority Data

Sep. 21, 1990 [JP] Japan ................. 2-252460

[51] Int. Cl.$^5$ ............... H01B 12/00; H01L 31/12
[52] U.S. Cl. ........................ 505/125; 505/775; 505/776; 505/777; 505/778; 505/779; 505/780; 505/781; 505/782; 505/783; 252/518; 252/521
[58] Field of Search ............ 505/1, 775, 776, 777, 505/778, 779, 780, 781, 782, 783; 252/518, 521

[56] References Cited

U.S. PATENT DOCUMENTS

| | | | |
|---|---|---|---|
| 4,880,771 | 11/1989 | Cava | 252/518 |
| 4,988,668 | 1/1991 | Engler | 505/783 |
| 4,990,488 | 2/1991 | von Schnering | 505/782 |
| 5,017,554 | 5/1991 | Subramanian | 505/783 |
| 5,019,553 | 5/1991 | Akimitsu | 505/783 |
| 5,036,044 | 7/1991 | Hermann | 505/783 |
| 5,073,536 | 12/1991 | Sheng | 505/783 |
| 5,093,312 | 3/1992 | Itozaki | 505/783 |
| 5,098,868 | 3/1992 | Wong | 505/782 |
| 5,126,316 | 6/1992 | Sleight | 505/782 |
| 5,173,475 | 12/1992 | Takada | 505/782 |
| 5,189,011 | 2/1993 | Itozaki | 505/782 |
| 5,194,421 | 3/1993 | Shimoda | 505/782 |

OTHER PUBLICATIONS

Zandbergen "Electron microscopy on $Pb_2Sr_2Ca_{0.5}Y_{0.5}Cu_3O_{8+\delta}$" Physica C v. 158 Apr. 1989 pp. 155–172.

Subramanian "Superconductivity near liquid nitrogen temperature . . ." Physica C v. 157 Jan. 1989 pp. 124–130.

Mochiky "Crystal structure of a new copper-oxide compound . . ." Jap. Jnl. Appl. Physic v. 29(8) Aug. 1990 pp. L1406–L1408.

Zandbergen "Surface decomposition of $Pb_2Sr_2(Ca_1Y)Cu_3O_{8+\delta}$ . . ." Physical Rev. B v. 40(16) Dec. 1, 1988 pp. 300–302.

Gallagher "Oxidation-Reduction of $Pb_2Sr_2Ln_{1-x}M_xCu_{z-y}Ag_yO_{8+\delta}$" Chemistry of Materials Apr. 1989 pp. 277–285.

Maeda "Synthesis and structural analysis of the superconducting lead caprates . . ." Physica C vol. 177 Jul. 1991 pp. 337–344.

Article: "Characterization of High Temperature Superconducting Thin Film Grown by Laser Ablation Method" Mat. Res. Soc. Symp. Proc. vol. 235 1992 by K. Shimizu; H. Nobumasa; N. Nagai; T. Matsunobe and T. Kawai (pp. 861–866).

(List continued on next page.)

Primary Examiner—Paul Lieberman
Assistant Examiner—M. Kopec
Attorney, Agent, or Firm—Birch, Stewart, Kolasch & Birch

[57] ABSTRACT

Provided is an oxide superconductor in which superconducting layer is sandwiched between two blocking layers having different compositions. Available superconducting layers include a one-layer system having one $Cu-O_2$ sheet, a two-layer system having a mediating layer sandwiched between two $Cu-O_2$ sheets, and a three-layer system having mediating layers sandwiched individually between three $Cu-O_2$ sheets.

Since the blocking layers are of different compositions, seventy-seven kinds of oxide superconductors can be obtained.

5 Claims, 25 Drawing Sheets

OTHER PUBLICATIONS

Article: "Infrared Properties of $Bi_2Sr_2Ca_{n-1}Cu_nO_y$," By K. Shimizu; H. Mobumasa; N. Nagai and T. Kawai Published by Elsevier Science Publishers B. V. *Physica C* pp. 949–950 (1991).

Article: "Structure Determination of the New High-Temperature Super-Conductor $Y_2Ba_4Cu_7O_{14-x}$" By P. Bordet; C. Chaillout; J. Chenavas; J. L. Hodeau; M. Marezio; J. Karpinski and E. Kaldis *Nature* vol. 334 Aug. 1988 pp. 596–598.

Article: "Ca- and La-substitution in $YBa_2Cu_3O_{7-\delta}$, $Y_2Ba_4Cu_7O_{15-\delta}$ and $YBa_2Cu_4O_8$" By R. G. Buckley; D. M. Pooke; J. L. Tallon; M. R. Presland, N. E. Flower; M. P. Staines; H. L. Johnson; M. Meylan; G. V. M. Williams & M. Bowden *Physica C* (1991) pp. 383–393.

Article: "Stability of 124, 123 and 247 Superconductors" By D. E. Morris; N. G. Asmar; J. H. Nickel; R. L. Sic; J. Y. T. Wei and J. E. Post *Physica C* (1989) pp. 287–294.

Article: "Synthesis and proerties of the 2:4:7 superconductors $R_2Ba_4Cu_7O_{15-x}$ (R–Y, Eu, Gd, Dy, Ho, Ex)" By D. E. Morris; N. G. Asmar; J. Y. T. Wei; J. H. Nickel; R. L. Sid; J. S. Scott and J. E. Post, *Physical Review* vol. 40 #16, pp. 11406–11409 Dec. 1989.

Article: "Superconducting $Yb_2Ba_4Cu_7O_x$ Produced by Oxidizing Metallic Presursors" By T. Kogure; R. Kontra, G. J. Yurek and J. B. Vander Sande *Physica C* (1988) pp. 45–56.

$La_2CuO_4$ $Y_1Ba_2Cu_3O_7$ $Bi_2Sr_2Ca_2Cu_3O_{10}$

• Cu
○ O
⊕ Sr
⊘ Ca,Y
⊖ Ba
⊖ Bi

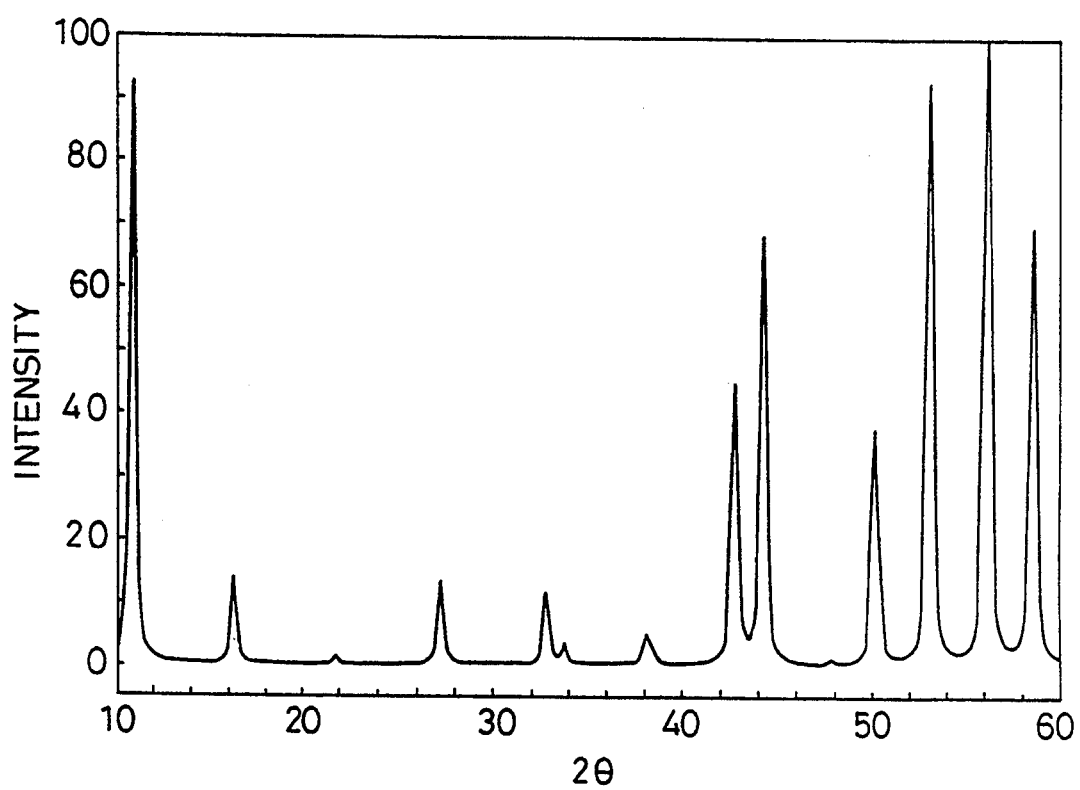
F I G. 26

5,372,990

OXIDE SUPERCONDUCTOR

FIELD OF THE INVENTION

The present invention relates to oxide superconductors adapted for use as magnet coil materials in nuclear fusion furnaces, electromagnetic fluid generators, accelerators, rotary electrical apparatuses (electric motors, generators, etc.). magnetic separators, magnetic floating trains, magnetic floating automobiles, magnetic floating elevators, nuclear magnetic resonance computed tomographs, magnetically-propelled ships, electron beam exposure devices, single crystal manufacturing apparatuses, various laboratory devices, etc., suited for applications which involve the problem of power loss in transmission lines, electrical energy storing devices, transformers, rectifiers, etc., further adapted for use in various elements, such as Josephson devices, SQUID, superconducting transistors, superconducting microwave transmission circuits, and furthermore, adapted for use as various function materials, such as infrared detection materials, magnetic shielding materials, etc.

BACKGROUND OF THE INVENTION

Conventionally approximately twenty kinds copper compound oxide superconductors with different crystal structures are known. Any of these copper compound oxide superconductors commonly includes, in its crystal structure, Cu-$O_2$ sheets through which superconducting current flows, and a stratified structure composed of repeated units each including the Cu-$O_2$ sheet and another layer situated at a predetermined distance therefrom.

In the case of the crystal structure of $La_2CuO_4$, for example, repeated units each including an $La_2O_2$ layer and a Cu-$O_2$ sheet are arranged in layers in the direction of a c-axis (direction perpendicular to the Cu-$O_2$ sheet), as shown in FIG. 1. In other words, one Cu-$O_2$ sheet is sandwiched between earth two $La_2O_2$ layers. This structure having one Cu-$O_2$ sheet between the aforesaid layers, will be referred to as a one-layer system, hereinafter.

In the case of this crystal structure, there is a slip for a ½ unit cell in each $La_2O_2$ layer with respect to the directions of a- and b-axes (directions within the plane of the Cu-$O_2$ sheet). Crystallographically, therefore, two $La_2O_2$ layers and two Cu-$O_2$ sheets constitute a repeated unit.

One-layer system oxide superconductors of this type include, for example, $Bi_2Sr_2CuO_6$, $Tl_2Ba_2CuO_6$, $Nd_2CuO_4$, and $Pb_2SrLaCu_2O_{6+\delta}$, which is described in "Physica C," vol. 166, 1990, pp. 502 to 512.

In the case of the crystal structure of $Y_1Ba_2Cu_3O_7$, moreover, repeated units each including a BaO-CuO-BaO layer, a first Cu-$O_2$ sheet, a Y layer, and a second Cu-$O_2$ sheet are arranged in layers in the direction of the c-axis, as shown in FIG. 2. Therefore, a unit composed of the first Cu-$O_2$ sheet, Y layer, and second Cu-$O_2$ sheet is sandwiched between each two BaO-CuO-BaO layers. This structure having two Cu-$O_2$ sheets in the aforesaid unit will be referred to as a two-layer system, hereinafter.

In the case of this crystal structure, in contrast with the case of the aforementioned $La_2CuO_4$, there is no slip with respect to the directions of tile a- and b-axes, so that the aforesaid repeated units are not different from crystallographic versions.

Two-layer system oxide superconductors of this type include, for example, $Bi_2Sr_2Ca_1Cu_2O_8$, $Tl_2Ba_2CaCu_2O_8$ described in "Nature", vol. 332, Mar. 31, 1988, pp. 420 to 422, $YBa_2Cu_4O_8$ described in "Nature", vol. 334, July 14, 1988, pp. 141 to 143, $Ba_2YCu_3O_{7-x}$ described in "Japanese Journal of Applied Physics", vol. 26, No. 5, May, 1987, pp. L649 to $La_{2-x}Ca_{1+x}Cu_2O_{6-x/2+\delta}$ described in "Materials Chemistry", vol. 7, 1982, pp. 413 to 427, and $Pb_2Sr_2(R, Ca)_1Cu_3O_{8+y}$ (R: rare earth element) described in "Physica C", vol. 157, 1989, pp. 124 to 130.

In the case of the crystal structure of $Bi_2Sr_2Ca_2Cu_3O_{10}$, repeated units each including a SrO-$Bi_2O_2$-SrO layer, a first Cu-$O_2$ sheet, a first Ca layer, a second Cu-$O_2$ sheet, a second Ca layer, and a third Cu-$O_2$ sheet are arranged in layers in the direction of the c-axis, as shown in FIG. 3. Therefore, a unit composed of the first Cu-$O_2$ sheet, first Ca layer, second Cu-$O_2$ sheet, second Ca layer, and third Cu-$O_2$ sheet is sandwiched between each two SrO-$Bi_2O_2$-SrO layers. This structure having three Cu-$O_2$ sheets in the aforesaid unit will be referred to as a three-layer system, hereinafter.

Also in the case of this crystal structure, as in the case of the aforementioned $La_2CuO_4$, there is a slip for a ½ unit cell in each SrO-$Bi_2O_2$-SrO layer with respect to the directions of the a- and b-axes. Crystallographically, therefore, the aforesaid two repeated units constitute a repeated unit.

Three-layer system oxide superconductors of this type include, for example, a Pb-Bi-Sr-Ca-Cu-O-based superconductor described in "Japanese Journal of Applied Physics", vol. 28, No. 5, May, 1989, pp. L787 to L790, a Tl-Pb-Sr-Ca-Cu-O-based superconductor described in "Science", vol. 242, October, 1988, pp. 249 to 252, and $Tl_1Ca_{n-1}Ba_2Cu_nO_{2n+3}$ (n=1, 2, 3) described in "Physical Review Letters", vol. 61, No. 6, August, 1988, pp. 750 to 753.

It is known that the greater the number of Cu-$O_2$ sheets in each unit, in the aforementioned one-, two-, and three-layer system superconductors, the higher the superconducting transition temperature (Tc) of the materials.

The inventors hereof analyzed the correlations between the Tc of the copper oxide superconductors described above and the interlayer distances between the Cu-$O_2$ sheets in their crystal structures, and presented the results of this analysis in "Physica C", vol. 167, 1990, pp. 515 to 519.

Thereupon, the inventors hereof discovered that the shorter the interlayer distances between the Cu-$O_2$ sheets of the crystal structures, the higher the value of Tc. In order to assign reasons for this phenomenon, the inventors hereof proposed that other layers interposed between the Cu-$O_2$ sheets through which superconducting current flows should be classified into blocking layers and mediating layers as they are studied.

In this case, the blocking layer, in the crystal structure, may be regarded as a layer for cutting the interaction between the Cu-$O_2$ sheets, through which the superconducting current flows, with the distance between the Cu-$O_2$ sheets not shorter than 6 angstroms, and further supplying carriers to the Cu-$O_2$ sheets to give the Cu-$O_2$ sheets a function for a superconducting current flow. The mediating layer, which is interposed between the Cu-$O_2$ sheets having -2-valent electric charge as a whole, may be regarded as a layer for neutralizing the electric charge, thereby enabling the whole crystal structure to be formed, and causing an interaction between the Cu-$O_2$ sheets with the distance between them not longer than 4 angstroms.

From this point of view, the one-layer system oxide superconductor shown in FIG. 1 can be considered to be constructed so that one Cu-$O_2$ sheet serving as a superconducting layer is sandwiched between each two identical $La_2O_2$ blocking layers.

In the case of the two-layer system oxide superconductor shown in FIG. 2, on the other hand, two blocking layers are formed individually of identical BaO-CuO-BaO layers, and the unit composed of the first Cu-$O_2$ sheet, Y layer as a mediating layer, and second Cu-$O_2$ sheet, sandwiched between the blocking layers, functions as a superconducting layer.

In the case of the three-layer system oxide superconductor shown in FIG. 3, the unit composed of the first Cu-$O_2$ sheet, first Ca layer as a first mediating layer, second Cu-$O_2$ sheet, second Ca layer as a second mediating layer, and third Cu-$O_2$ sheet sandwiched between each two identical SrO-$Bi_2O_2$-SrO(blocking) layers, and this unit functions as a superconducting layer.

Thus, according to the concept proposed by the inventors hereof, the crystal structure of the conventionally proposed copper oxide superconductors can be considered to be designed so that a superconducting layer is sandwiched between each two identical blocking layers, and it can be concluded that this superconducting layer is composed of one Cu-$O_2$ sheet, or of two (for a two-layer system) or three (for a three-layer system) Cu-$O_2$ sheets with a mediating layer between them.

If the conventionally known copper oxide superconductors are viewed at this angle, the blocking layers may be classified into the following 8 types:

$La_2O_2$-type,
BaO-CuO-BaO-type,
BaO-CuO-CuO-BaO-type,
SrO-$Bi_2O_2$-SrO-type,
BaO-$Tl_2O_2$-BaO-type or BaO-TlO-BaO-type,
SrO-PbO-Cu-PbO-SrO-type,
SrO-(Pb, Cu)O-SrO-type or SrO-(Pb, Sr)O-SrO-type,
and
$Ln_2O_2$-type (Ln is selected from Nd, Sm, Eu, and Gd).

Further, the mediating layer may be formed of Ca, Sr, Y, Nd, Sm, Eu, Gd, Dy, Ho, Er, Tm, Yb, or Lu.

The materials of the one-layer system shown in FIG. 1 have blocking layers of only one kind except those ones which include $Ln_2O_2$-type blocking layers. In either of the two- and three-layer systems shown in FIGS. 2 and 3, moreover, the blocking layers in the crystal structures are of only one kind.

Accordingly, the conventional copper oxide superconductors are limited to about 20 kinds, so that fields of their industrial application are restricted.

SUMMARY OF THE INVENTION

An object of the present invention is to provide copper oxide superconductors, in which the approximately twenty kinds of conventionally found copper oxide superconductors can be increased to about seventy-seven kinds, so that the materials can be applied to a wider variety of fields.

Another object of the present invention is to provide copper oxide superconductors having Tc higher than that of conventional copper oxide superconductors.

According to the present invention, there is first provided an oxide superconductor comprising repeated units each including a first blocking layer having a composition selected from the following group, a first Cu-$O_2$ sheet, a second blocking layer having a composition selected from the following group and different from the composition of the first blocking layer, and a second Cu-$O_2$ sheet, arranged in layers in the order named,
the group including:
$La_2O_2$,
BaO-CuO-BaO,
BaO-CuO-CuO-BaO,
SrO-$Bi_2O_2$-SrO,
BaO-$Tl_2O_2$-BaO,
BaO-TlO-BaO,
SrO-PbO-Cu-PbO-SrO,
SrO-(Pb, Cu)O-SrO, and
SrO-(Pb, Sr)O-SrO.

This superconductor will hereinafter be referred to as a one-layer system oxide superconductor. According to the present invention, moreover, there is provided an oxide superconductor comprising repeated units each including a first blocking layer having a composition selected from the following group a, a first Cu-$O_2$ sheet, a first mediating layer composed of elements selected from the following group b, a second Cu-$O_2$ sheet, a second blocking layer having a composition selected from the following group a and different from the composition of the first blocking layer, a third Cu-$O_2$ sheet, a second mediating layer composed of elements selected from the following group b, and a fourth Cu-$O_2$ sheet, arranged in layers in the order named,
the group a including:
$La_2O_2$,
BaO-CuO-BaO,
BaO-CuO-CuO-BaO,
SrO-$Bi_2O_2$-SrO,
BaO-$Tl_2O_2$-BaO,
BaO-TlO-BaO,
SrO-PbO-Cu-PbO-SrO,
SrO-(Pb, Cu)O-SrO,
SrO-(Pb, Sr)O-SrO, and
$Ln_2O_2$
(where Ln is selected from Nd, Sm, Eu and Gd),
the group b including:
Ca, St, Y, Nd, Sm, Eu, Gd, Dy, Ho, Er, Tm, Yb and Lu. This superconductor will hereinafter be referred to as a two-layer system oxide superconductor.

According to the present invention, furthermore, there is provided an oxide superconductor comprising repeated units each including a first blocking layer having a composition selected from the following group a, a first Cu-$O_2$ sheet, a first mediating layer composed of elements selected from the following group b, a second Cu-$O_2$ sheet, a second mediating layer composed of elements selected from the following group b, a third Cu-$O_2$ sheet, a second blocking layer having a composition selected from the following group a and different from the composition of the first blocking layer, a fourth Cu-$O_2$ sheet, a third mediating layer composed of elements selected from the following group b, a fifth Cu-$O_2$ sheet, a fourth mediating layer composed of elements selected from the following group b, and a sixth Cu-$O_2$ sheet, arranged in layers in the order named,
the group a including:
$La_2O_2$, BaO-CuO-BaO,
BaO-CuO-CuO-BaO,
SrO-Bi$_2$O$_2$-SrO,
BaO-Tl$_2$O$_2$-BaO,
BaO-TlO-BaO,
SrO-PbO-Cu-PbO-SrO,
SrO-(Pb, Cu)O-SrO,
SrO-(Pb, Sr)O-SrO, and
Ln$_2$O$_2$ (where Ln is selected from Nd, Sm, Eu and Gd), the group b including:

Ca, St, Y, Nd, Sm, Eu, Gd, Dy, Ho, Er, Tm, Yb and Lu. This superconductor will hereinafter be referred to as a three-layer system oxide superconductor.

In the oxide superconductor according to the present invention, Tc thereof can be increased if the interlayer distance between the Cu-O$_2$ sheets in the crystal structure is made shorter. The present invention is based on an inference that the interlayer distance between the Cu-O$_2$ sheets may possibly be restricted by the state of the blocking layers adjacent to the sheets.

As mentioned before, the blocking layers serve to supply the earriers to the Cu-O$_2$ sheets, as well as to cut off the interaction between the Cu-O$_2$ sheets.

Each known copper oxide superconductor has blocking layers of the same composition. It can be inferred, however, that even materials which include different kinds of blocking layer compositions can become superconductors as long as they can fulfill the aforementioned functions. But it can be guessed that the presence of the different kind of blocking layers causes some crystal strain in the crystal structure obtained.

First, diagrams of these three kinds of oxide superconductors are shown in FIGS. 4, 5 and 6.

In the one-layer system oxide superconductor of FIG. 4, a first blocking layer B11 having a composition selected from the aforesaid group, a first Cu-O$_2$ sheet C11, a second blocking layer B12 having a composition different from that of the first blocking layer, and a second Cu-O$_2$ sheet C12 are arranged in layers in the c-axis direction, in the order named, thus constituting a repeated unit U1, and a Cu-O$_2$ sheet C11 (C12) sandwiched between two blocking layers B11 and B12 forms a superconducting layer. Further, the Cu-O$_2$ sheet situated between these two blocking layers B11 and B12 is a single layer, and minimum units L11 and L12, which are necessary for superconductivity, constitute base units.

In the two-layer system oxide superconducting material of FIG. 5, a first blocking layer B21 having a composition selected from the aforesaid group a, a first Cu-O$_2$ sheet C21, a first mediating layer M21 composed of elements selected from the aforesaid group b, a second Cu-O$_2$ sheet C22, a second blocking layer B22 having a composition different from that of the first blocking layer, a third Cu-O$_2$ sheet C23, a second mediating layer M22 composed of elements selected from the aforesaid group b, and a fourth Cu-O$_2$ sheet C24 are arranged in layers in the c-axis direction, in the order named, thus constituting a repeated unit U2, and a unit S21, which includes the first Cu-O$_2$ sheet C21, mediating layer M21, and second Cu-O$_2$ sheet C22, and a unit S22, which includes the third Cu-O$_2$ sheet C23, second mediating layer M22, and fourth Cu-O$_2$ sheet C24, form superconducting layers. In this case, L21 and L22 constitute base units.

In the three-layer system oxide superconductor of FIG. 6, a first blocking layer B31 having a composition selected from the aforesaid group a, a first Cu-O$_2$ sheet C31, a first mediating layer M31 composed of elements selected from the aforesaid group b, a second Cu-O$_2$ sheet C32, a second mediating layer M32 composed of elements selected from the aforesaid group b, a third Cu-O$_2$ sheet C33, a second blocking layer B32 having a composition different from that of the first blocking layer, a fourth Cu-O$_2$ sheet C34, a third mediating layer M33 composed of elements selected from the aforesaid group b, a fifth Cu-O$_2$ sheet C35, a fourth mediating layer M34 composed of elements selected from the aforesaid group b, and sixth Cu-O$_2$ sheet C36 are arranged in layers in the c-axis direction, in the order named, thus constituting a repeated unit U3, and a unit S31, which includes the first Cu-O$_2$ sheet C31, first mediating layer M31, second Cu-O$_2$ sheet C32, second mediating layer M32, and third Cu-O$_2$ sheet C33, and a unit S32, which includes the fourth Cu-O$_2$ sheet C34, third mediating layer M33, fifth Cu-O$_2$ sheet C35, fourth mediating layer M34, and sixth Cu-O$_2$ sheet C36, form superconducting layers. In this case, L31 and L32 constitute base units.

In any of the above-described cases of the one-, two-, and three-layer systems, one repeated unit directly constitutes a crystallographic repeated unit if neither of the first and second blocking layers is slipped with respect to a direction or directions (a-axis direction and/or b-axis direction) perpendicular to the c-axis. If either of the first and second blocking layers is slipped in the a-axis direction and/or b-axis direction, however, two repeated units constitute one crystallographic repeated unit. If both of the first and second blocking layers are slipped, and if the first and second blocking layers are slipped in the same manner, one repeated unit directly constitutes a crystallographic repeated unit. If the first and second blocking layers are slipped in different ways, however, two repeated units constitute one crystallographic repeated unit.

In the case of the oxide superconductors found so far, each of which includes only one kind of blocking layers, that is, in the case where the first and second blocking layers are identical with each other, the aforementioned base unit and repeated unit are identical.

In each of these oxide superconductors, the composition which constitutes each blocking layer is not always a stoichiometric composition on account of excess or deficiency of oxygen.

In the case of SrO-Bi$_2$O$_2$-SrO, for example, excessive oxygen is often contained in practice, and the composition of this blocking layer is Bi$_2$Sr$_2$O$_{4+\delta}$.

The same may be said of BaO-Tl$_2$O$_2$-BaO or BaO-TlO-BaO, and the respective compositions of these blocking layers are Tl$_2$Ba$_2$O$_{4+\delta}$ and TlBa$_2$O$_{3+\delta}$.

Also in the case of SrO-PbO-Cu-PbO-SrO, oxygen is often excessively introduced in practice, and the composition of this blocking layer is Pb$_2$Sr$_2$CuO$_{4+\delta}$.

In the cases of other compositions, that is. BaO-CuO-BaO or BaO-CuO-CuO-BaO, La$_2$O$_2$, SrO-(Pb, Cu)O-SrO, SrO-(Pb, Sr)O-SrO, and Ln$_2$O$_2$, on the other hand, oxygen is often deficient, and the respective compositions of these blocking layers are Ba$_2$CuO$_{3-\delta}$, Ba$_2$Cu$_2$O$_{4-\delta}$, La$_2$O$_{2-\delta}$, (Pb, Cu)Sr$_2$O$_{3-\delta}$, (Pb, Sr)Sr$_2$O$_{3-\delta}$, and Ln$_2$O$_{2-\delta}$.

In any of the aforesaid compositions, the length of its crystal cell is equal or approximately equal to the Cu-O bond length of the Cu-O$_2$ sheets. In forming the whole crystal structure by the method mentioned below, therefore, the blocking layers of these compositions fit the Cu-O$_2$ sheets, thus stabilizing the crystal structure.

In forming each superconductor with the blocking layers of these compositions, different compositions are selected for the first and second blocking layers mentioned above. This is because it is estimated, although without any obvious reasons, that if the superconducting layer is sandwiched between the different kinds of blocking layers, a strain is caused in the superconducting layer, so that the Tc is higher than in the case where the superconductor is sandwiched between blocking layers of the same kind.

If the composition used for each blocking layer of the two- and three-layer systems is Ln$_2$O$_2$, moreover, only one of the aforesaid elements may be used as Ln, or two or more may be suitably selected for use.

Likewise, one or two or more elements may be selected from the group b.

In the oxide superconductors of the present invention, whether the one-, two-, or three-layer type, superconducting charge carriers are holes. As in the case of the known copper oxide superconductors, therefore, superconductors are obtained when the hole density of the Cu-O$_2$ sheet is not lower than 0.01 or not higher than 0.5 per Cu atom.

In order to adjust the carrier concentration to the aforesaid ranges, the oxygen content in the composition used may deviate somewhat from its stoichiometric value, or some of the cations which constitute the composition may be substituted by other cations in forming the blocking layers by the method mentioned below.

In oxide superconductors one of whose blocking layers consist of SrO-PbO-Cu-PbO-SrO, the valency of Cu in the blocking layer, which makes no change, is +1, so that the hole density per Cu atom is calculated taking valency of Cu as +1.

In this calculation, moreover, all the respective valency of La, Bi, Tl, Ln (Nd, Sm, Eu, Gd, Dy, Ho, Tm, Yb and Lu) are all regarded as +3, all the respective valency of Ba, Sr and Ca as +2, and the valency of 0 as −2. Pb can take valency of +2 and +4. In this case, therefore, the valency of Pb is regarded as +3, the average of +2 and +4. In forming blocking layers of SrO-PbO-Cu-PbO-SrO, however, the valency of Pb is regarded as +2.

The holes are supplied mainly by changing the heat treatment conditions under various oxygen partial pressures to control the oxygen content in the crystal structure, during the manufacture of an oxide superconductor, or by substitution of some of the elements in the blocking layers.

In the case of heat treatment under the various oxygen partial pressures, for example, the oxygen partial pressure is varied within the range 0.001 to 1,000 arm. When the oxygen partial pressure is lower than 1 arm., the superconductor is annealed for from 1 to 100 hours at a temperature ranging from about 300° C. to less than the melting point of the material, and is then rapidly cooled to the temperature of liquid nitrogen. By doing this, an oxygen deficiency is caused to reduce the oxygen content, whereby the hole concentration is lowered.

When the oxygen partial pressure is higher than 1 atm., on the other hand, the superconductor is annealed for from i to 100 hours at a temperature ranging from about 300° C. to less than the melting point of the material. Then, the oxygen deficiency is eliminated by slowly cooling the superconductor in a furnace, or excessive oxygen is introduced into the furnace to increase the oxygen content, whereby the hole concentration is increased. Moreover, the hole concentration can be increased by increase of oxygen content by mixing ozone with oxygen in an oxygen atmosphere during the heat treatment.

Since this hole concentration control method can be carried out as a separate process even after the intended crystal structure is manufactured, it is particularly suited for the case where the holes are just enough in number so that no crystal can be obtained unless the electric charge on the whole crystal is balanced, or the case where the range of the partial pressure of oxygen in the atmosphere must be limited in order to grow the crystal.

The following is a description of a method for controlling the hole concentration by the substitution of some of the elements in the blocking layers.

In the case of La$_2$O$_2$, for example, holes can be supplied by substituting +2-valent Ba, Sr or Ca or +1-valent Na for some of +3-valent La.

In the case of BaO-CuO-BaO or BaO-CuO-CuO-BaO, the hole concentration can be controlled by substituting a +1-valent alkaline metal, such as Na, for Ba to supply holes, or by substituting Sr or Pb for some of Ba to change the atom packing state of the crystal structure, thereby changing the facility of oxygen introduction. Also, the hole concentration can be controlled by substituting Al or Ga for Cu.

In the case of SrO-Bi$_2$O$_2$-SrO, the hole concentration can be controlled by substituting +2-valent Pb for some of +3-valent Bi to supply holes, or by substituting +3-valent La for some of +2-valent Sr to reduce holes.

In the case of BaO-Tl$_2$O$_2$-BaO or BaO-TlO-BaO, the hole concentration can be controlled by substituting +2-valent Pb for some of +3-valent Tl to supply holes, or by substituting +3-valent La for some of +2-valent Ba to change the atom packing state of the crystal structure, thereby changing the facility of oxygen introduction.

In the case of SrO-PbO-Cu-PbO-SrO, SrO-(Pb, Cu)O-SrO, or SrO-(Pb, Sr)O-SrO, the hole concentration can be controlled by substituting +3-valent La for some of +2-valent Sr to reduce holes, or by substituting Ba or Ca for some of Sr to change the atom packing state of the crystal structure, thereby changing the facility of oxygen introduction.

In the case of Ln$_2$O$_2$, the carrier concentration can be controlled by substituting a +2-valent alkaline earth metal, such as Ca or Mg, for some of +3-valent Ln to supply holes, or by substituting +4-valent Ce or Th for some of +3-valent Ln to reduce holes.

In the cases of two- and three-layer system oxide superconductors, moreover, the hole concentration can be controlled by changing the combination ratios between +2-valent Ca or Sr and +3-valent Y, Nd, Sm, Eu, Gd, Dy, Ho, Er, Tm, Yb and Lu in selecting the elements for the mediating layers from the aforesaid group b.

The oxide superconductors of the present invention will now be enumerated with reference to models of the repeating units (U1, U2 and U3) shown in FIGS. 4 to 6.

These models are combinations of the blocking layers, Cu-O$_2$ sheets, and mediating layers. The compositions of the blocking layers are expressed in the same manner as the composition group for the one-layer system and the group a for the two- and three-layer systems. Actually, however, the oxygen content may be somewhat deviated from its stoichiometric value, or some cations may be replaced, in order to adjust the carrier concentration, as mentioned before. For the two- and three-layer system oxide superconductors, moreover, the mediating layers composed of the elements selected from the group b are designated by M's. Further, the one-, two-, and three-layer system oxide superconductors are designated individually by serial numbers, e.g., "1-16," "2-10," and "3-5."

There are 21 kinds of one-layer system oxide superconductors as follows:

1—1: $BaO\text{-}CuO\text{-}BaO/Cu\text{-}O_2/La_2O_2/Cu\text{-}O_2$,
1-2: $BaO\text{-}CuO\text{-}CuO\text{-}BaO/Cu\text{-}O_2/La_2O_2/Cu\text{-}O_2$,
1-3: $BaO\text{-}CuO\text{-}CuO\text{-}BaO/Cu\text{-}O_2/BaO\text{-}CuO\text{-}BaO/Cu\text{-}O_2$,
1-4: $SrO\text{-}Bi_2O_2\text{-}SrO/Cu\text{-}O_2/La_2O_2/Cu\text{-}O_2$,
1-5: $SrO\text{-}Bi_2O_2\text{-}SrO/Cu\text{-}O_2/BaO\text{-}CuO\text{-}BaO/Cu\text{-}O_2$,
1-6: $SrO\text{-}Bi_2O_2\text{-}SrO/Cu\text{-}O_2/BaO\text{-}CuO\text{-}CuO\text{-}BaO/Cu\text{-}O_2$,
1-7: $(BaO\text{-}Tl_2O_2\text{-}BaO)$ or $(BaO\text{-}TlO\text{-}BaO)/Cu\text{-}O_2/La_2O_2/Cu\text{-}O_2$,
1-8: $(BaO\text{-}Tl_2O_2\text{-}BaO)$ or $(BaO\text{-}TlO\text{-}BaO)/Cu\text{-}O_2/BaO\text{-}CuO\text{-}BaO/Cu\text{-}O_2$,
1-9: $(BaO\text{-}Tl_2O_2\text{-}BaO)$ or $(BaO\text{-}TlO\text{-}BaO)/Cu\text{-}O_2/BaO\text{-}CuO\text{-}CuO\text{-}BaO/Cu\text{-}O_2$,,
1-10: $(BaO\text{-}Tl_2O_2\text{-}BaO)$ or $(BaO\text{-}TlO\text{-}BaO)/Cu\text{-}O_2/SrO\text{-}Bi_2O_2\text{-}SrO/Cu\text{-}O_2$,
1-11: $SrO\text{-}PbO\text{-}Cu\text{-}PbO\text{-}SrO/Cu\text{-}O_2/La_2O_2/Cu\text{-}O_2$,
1-12: $SrO\text{-}PbO\text{-}Cu\text{-}PbO\text{-}SrO/Cu\text{-}O_2/BaO\text{-}CuO\text{-}BaO/Cu\text{-}O_2$,
1-13: $SrO\text{-}PbO\text{-}Cu\text{-}PbO\text{-}SrO/Cu\text{-}O_2/BaO\text{-}CuO\text{-}CuO\text{-}BaO/Cu\text{-}O_2$,
1-14: $SrO\text{-}PbO\text{-}Cu\text{-}PbO\text{-}SrO/Cu\text{-}O_2/SrO\text{-}Bi_2O_2\text{-}SrO/Cu\text{-}O_2$,
1-15: $SrO\text{-}PbO\text{-}Cu\text{-}PbO\text{-}SrO/Cu\text{-}O_2/(BaO\text{-}Tl_2O_2\text{-}BaO)$ or $(BaO\text{-}TlO\text{-}BaO)/Cu\text{-}O_2$,
1-16: $(SrO\text{-}(Pb, Cu)O\text{-}SrO)$ or $SrO\text{-}(Pb, Sr)O\text{-}SrO/Cu\text{-}O_2/La_2O_2/Cu\text{-}O_2$,
1-17: $(SrO\text{-}(Pb, Cu)O\text{-}SrO)$ or $SrO\text{-}(Pb, Sr)O\text{-}SrO/Cu\text{-}O_2/BaO\text{-}CuO\text{-}BaO/Cu\text{-}O_2$,
1-18: $(SrO\text{-}(Pb, Cu)O\text{-}SrO)$ or $SrO\text{-}(Pb, Sr)O\text{-}SrO/Cu\text{-}O_2/BaO\text{-}CuO\text{-}CuO\text{-}BaO/Cu\text{-}O_2$,
1-19: $(SrO\text{-}(Pb, Cu)O\text{-}SrO)$ or $SrO\text{-}(Pb, Sr)O\text{-}SrO/Cu\text{-}O_2/SrO\text{-}Bi_2O_2\text{-}SrO/Cu\text{-}O_2$,
1-20: $(SrO\text{-}(Pb, Cu)O\text{-}SrO)$ or $SrO\text{-}(Pb, Sr)O\text{-}SrO/Cu\text{-}O_2/(BaO\text{-}Tl_2O_2\text{-}BaO)$ or $(BaO\text{-}TlO\text{-}BaO)/Cu\text{-}O_2$,
1-21: $(SrO\text{-}(Pb, Cu)O\text{-}SrO)$ or $SrO\text{-}(Pb, Sr)O\text{-}SrO/Cu\text{-}O_2/SrO\text{-}PbO\text{-}Cu\text{-}PbO\text{-}SrO/Cu\text{-}O_2$.

There are 28 kinds of two-layer system oxide superconductors as follows:

2-1: $BaO\text{-}CuO\text{-}BaO/Cu\text{-}O_2/M/Cu\text{-}O_2/La_2O_2/M/Cu\text{-}O_2$,
2—2: $BaO\text{-}CuO\text{-}CuO\text{-}BaO/Cu\text{-}O_2/M/Cu\text{-}O_2/La_2O_2/Cu\text{-}O_2/M/Cu\text{-}O_2$,
2-3: $BaO\text{-}CuO\text{-}CuO\text{-}BaO/Cu\text{-}O_2/M/Cu\text{-}O_2/BaO\text{-}CuO\text{-}BaO/Cu\text{-}O_2/M/Cu\text{-}O_2$,
2-4: $SrO\text{-}Bi_2O_2\text{-}SrO/Cu\text{-}O_2/M/Cu\text{-}O_2/La_2O_2/M/Cu\text{-}O_2$,
2-5: $SrO\text{-}Bi_2O_2\text{-}SrO/Cu\text{-}O_2/M/Cu\text{-}O_2/BaO\text{-}CuO\text{-}BaO/Cu\text{-}O_{O2}/M/Cu\text{-}O_2$,
2-6: $SrO\text{-}Bi_2O_2\text{-}SrO/Cu\text{-}O_2/M/Cu\text{-}O_2/BaO\text{-}CuO\text{-}CuO\text{-}BaO/Cu\text{-}O_2/M/Cu\text{-}O_2$,
2-7: $(BaO\text{-}Tl_2O_2\text{-}BaO)$ or $(BaO\text{-}TlO\text{-}BaO)/Cu\text{-}O_2/M/Cu\text{-}O_2/La_2O_2/Cu\text{-}O_2/M/Cu\text{-}O_2$,
2-8: $(BaO\text{-}Tl_2O_2\text{-}BaO)$ or $(BaO\text{-}TlO\text{-}BaO)/Cu\text{-}O_2/M/Cu\text{-}O_2/BaO\text{-}CuO\text{-}BaO/Cu\text{-}O_2/M/Cu\text{-}O_2$,
2-9: $(BaO\text{-}Tl_2O_2\text{-}BaO)$ or $(BaO\text{-}TlO\text{-}BaO)/Cu\text{-}O_2/M/Cu\text{-}O_2/BaO\text{-}CuO\text{-}CuO\text{-}BaO/Cu\text{-}O_2/M/Cu\text{-}O_2$,
2-10: $(BaO\text{-}Tl_2O_2\text{-}BaO)$ or $(BaO\text{-}TlO\text{-}BaO)/Cu\text{-}O_2/M/Cu\text{-}O_2/SrO\text{-}Bi_2O_2\text{-}SrO/Cu\text{-}O_2/M/Cu\text{-}O_2$,
2-11: $SrO\text{-}PbO\text{-}Cu\text{-}PbO\text{-}SrO/Cu\text{-}O_2/M/Cu\text{-}O_2/La_2O_2/Cu\text{-}O_2/M/Cu\text{-}O_2$,
2-12: $SrO\text{-}PbO\text{-}Cu\text{-}PbO\text{-}SrO/Cu\text{-}O_2/M/Cu\text{-}O_2/BaO\text{-}CuO\text{-}BaO/Cu\text{-}O_2/M/Cu\text{-}O_2$,
2-13: $SrO\text{-}PbO\text{-}Cu\text{-}PbO\text{-}SrO/Cu\text{-}O_2/M/Cu\text{-}O_2/BaO\text{-}CuO\text{-}CuO\text{-}BaO/Cu\text{-}O_2/M/Cu\text{-}O_2$,
2-14: $SrO\text{-}PbO\text{-}Cu\text{-}PbO\text{-}SrO/Cu\text{-}O_2/M/Cu\text{-}O_2/SrO\text{-}Bi_2O_2\text{-}SrO/Cu\text{-}O_2/M/Cu\text{-}O_2$,
2-15: $SrO\text{-}PbO\text{-}Cu\text{-}PbO\text{-}SrO/Cu\text{-}O_2/M/Cu\text{-}O_2/BaO\text{-}Tl_2O_2\text{-}BaO)$ or $(BaO\text{-}TlO\text{-}BaO)/Cu\text{-}O_2/M/Cu\text{-}O_2$,
2-16: $(SrO\text{-}(Pb, Cu)O\text{-}SrO)$ or $SrO\text{-}(Pb, Sr)O\text{-}SrO/Cu\text{-}O_2/M/Cu\text{-}O_2/La_2O_2/Cu\text{-}O_2/M/Cu\text{-}O_2$,
2-17: $(SrO\text{-}(Pb, Cu)O\text{-}SrO)$ or $SrO\text{-}(Pb, Sr)O\text{-}SrO/Cu\text{-}O_2/M/Cu\text{-}O_2/BaO\text{-}CuO\text{-}BaO/Cu\text{-}O_2/M/Cu\text{-}O_2$,
2-18: $(SrO\text{-}(Pb, Cu)O\text{-}SrO)$ or $SrO\text{-}(Pb, Sr)O\text{-}SrO/Cu\text{-}O_2/M/Cu\text{-}O_2/BaO\text{-}CuO\text{-}CuO\text{-}BaO/Cu\text{-}O_2/M/Cu\text{-}O_2$,
2-19: $(SrO\text{-}(Pb, Cu)O\text{-}SrO)$ or $SrO\text{-}(Pb, Sr)O\text{-}SrO/Cu\text{-}O_2/M/Cu\text{-}O_2/SrO\text{-}Bi_2O_2\text{-}SrO/Cu\text{-}O_2/M/Cu\text{-}O_2$,
2-20: $(SrO\text{-}(Pb, Cu)O\text{-}SrO)$ or $SrO\text{-}(Pb, Sr)O\text{-}SrO/Cu\text{-}O_2/M/Cu\text{-}O_2/(BaO\text{-}Tl_2O_2\text{-}BaO)$ or $(BaO\text{-}TlO\text{-}BaO)/Cu\text{-}O_2/M/Cu\text{-}O_2$,
2-21: $(SrO\text{-}(Pb, Cu)O\text{-}SrO)$ or $SrO\text{-}(Pb, Sr)O\text{-}SrO/Cu\text{-}O_2/M/Cu\text{-}O_2/SrO\text{-}PbO\text{-}Cu\text{-}PbO\text{-}SrO/Cu\text{-}O_2/M/Cu\text{-}O_2$,
2-22: $Ln_2O_2/Cu\text{-}O_2/M/Cu\text{-}O_2/La_2O_2/Cu\text{-}O_2//M/Cu\text{-}O_2$,
2-23: $Ln_2O_2/Cu\text{-}O_2/M/Cu\text{-}O_2/BaO\text{-}CuO\text{-}BaO/Cu\text{-}O_2/M/Cu\text{-}O_2$,
2-24: $Ln_2O_2/Cu\text{-}O_2/M/Cu\text{-}O_2/BaO\text{-}CuO\text{-}CuO\text{-}BaO/Cu\text{-}O_2/M/Cu\text{-}O_2$,
2-25: $Ln_2O_2/Cu\text{-}O_2/M/Cu\text{-}O_2/SrO\text{-}Bi_2O_2\text{-}SrO/Cu\text{-}O_2/M/Cu\text{-}O_2$,
2-26: $Ln_2O_2/Cu\text{-}O_2/M/Cu\text{-}O_2/(BaO\text{-}Tl_2O_2\text{-}BaO)$ or $(BaO\text{-}TlO\text{-}BaO)/Cu\text{-}O_2/M/Cu\text{-}O_2$,
2-27: $Ln_2O_2/Cu\text{-}O_2/M/Cu\text{-}O_2/SrO\text{-}PbO\text{-}Cu\text{-}PbO\text{-}SrO/Cu\text{-}O_2/M/Cu\text{-}O_2$,
2-28: $Ln_2O_2/Cu\text{-}O_2/M/Cu\text{-}O_2/(SrO\text{-}(Pb, Cu)O\text{-}SrO)$ or $SrO\text{-}(Pb, Sr)O\text{-}SrO/Cu\text{-}O_2/M/Cu\text{-}O_2$.

There are 28 kinds of three-layer system oxide superconductors as follows:

3-1: $BaO\text{-}CuO\text{-}BaO/Cu\text{-}O_2/M/Cu\text{-}O_2/M/Cu\text{-}O_2/La_2O_2/Cu\text{-}O_2/M/Cu\text{-}O_2/M/Cu\text{-}O_2$,
3-2: $BaO\text{-}CuO\text{-}CuO\text{-}BaO/Cu\text{-}O_2/M/Cu\text{-}O_2/M/Cu\text{-}O_2/La_2O_2/Cu\text{-}O_2/M/Cu\text{-}O_2/M/Cu\text{-}O_2$,
3—3: $BaO\text{-}CuO\text{-}CuO\text{-}BaO/Cu\text{-}O_2/M/Cu\text{-}O_2/M/Cu\text{-}O_2/BaO\text{-}CuO\text{-}BaO/Cu\text{-}O_2/M/Cu\text{-}O_2/M/Cu\text{-}O_2$,
3-4: $SrO\text{-}Bi_2O_2\text{-}SrO/Cu\text{-}O_2/M/Cu\text{-}O_2/M/Cu\text{-}O_2/La_2O_2/Cu\text{-}O_2/M/Cu\text{-}O_2/M/Cu\text{-}O_2$,
3-5: $SrO\text{-}Bi_2O_2\text{-}SrO/Cu\text{-}O_2/M/Cu\text{-}O_2/M/Cu\text{-}O_2/BaO\text{-}CuO\text{-}BaO/Cu\text{-}O_2/M/Cu\text{-}O_2/M/Cu\text{-}O_2$,
3-6: $SrO\text{-}Bi_2O_2\text{-}SrO/Cu\text{-}O_2/M/Cu\text{-}O_2/M/Cu\text{-}O_2/BaO\text{-}CuO\text{-}CuO\text{-}BaO/Cu\text{-}O_2/M/Cu\text{-}O=/M/Cu\text{-}O_2$,
3-7: $(BaO\text{-}Tl_2O_2\text{-}BaO)$ or $(BaO\text{-}TlO\text{-}BaO)/Cu\text{-}O_2/M/Cu\text{-}O_2/M/Cu\text{-}O_2/La_2O_2/Cu\text{-}O_2/M/Cu\text{-}O_2/M/Cu\text{-}O_2$, 3-8: $(BaO\text{-}Tl_2O_2\text{-}BaO)$ or $(BaO\text{-}TlO\text{-}BaO)/Cu\text{-}O_2/M/Cu\text{-}O_2/M/Cu\text{-}O_2/BaO\text{-}CuO\text{-}BaO/Cu\text{-}O_2/M/Cu\text{-}O_2/M/Cu\text{-}O_2$, 3-9: $(BaO\text{-}Tl_2O_2\text{-}BaO)$ or $(BaO\text{-}TlO\text{-}BaO)/Cu\text{-}O_2//M/Cu\text{-}O_2/M/Cu\text{-}O_2/BaO\text{-}CuO\text{-}CuO\text{-}BaO/\text{-}Cu\text{-}O_2/M/Cu\text{ -}O_2/M/Cu\text{-}O_2$, 3-10: $(BaO\text{-}Tl_2O_2\text{-}BaO)$ or $(BaO\text{-}TlO\text{-}BaO\ )/Cu\text{-}O_2/M/Cu\text{-}O_2/M/Cu\text{-}O_2/SrO\text{-}Bi_2O_2\text{-}SrO/Cu\text{-}O_2/M/Cu\text{-}O_2/M/Cu\text{-}O_2$, 3-11: $SrO\text{-}PbO\text{-}Cu\text{-}PbO\text{-}Sr/Cu\text{-}O_2/M/Cu\text{-}O_2/M/Cu\text{-}O_2/La_2O_2/Cu\text{-}O_2/M/Cu\text{-}O_2/M/Cu\text{-}O_2$, 3-12: $SrO\text{-}PbO\text{-}Cu\text{-}PbO\text{-}SrO/Cu\text{-}O_2/M/Cu\text{-}O_2/M/Cu\text{-}O_2/BaO\text{-}CuO\text{-}BaO/Cu\text{-}O_2/M/Cu\text{-}O_2/M/Cu\text{-}O_2$, 3-13: $SrO\text{-}PbO\text{-}Cu\text{-}PbO\text{-}SrO/Cu\text{-}O_2/M/Cu\text{-}O_2/M/Cu\text{-}O_2/BaO\text{-}CuO\text{-}CuO\text{-}BaO/Cu\text{-}O_2/M/Cu\text{-}O_2/M/Cu\text{-}O_2$, 3-14: $SrO\text{-}PbO\text{-}Cu\text{-}PbO\text{-}SrO/Cu\text{-}O_2/M/Cu\text{-}O_2/M/Cu\text{-}O_2/SrO\text{-}Bi_2O_2\text{-}SrO/Cu\text{-}O_2/M/Cu\text{-}O_2/M/Cu\text{-}O_2$, 3-15: $SrO\text{-}PbO\text{-}Cu\text{-}PbO\text{-}SrO/Cu\text{-}O_2/M/Cu\text{-}O_2/M/Cu\text{-}O_2/(BaO\text{-}Tl_2O_2\text{-}BaO)$ or $(BaO\text{-}TlO\text{-}BaO)/Cu\text{-}O_2/M/Cu\text{-}O_2/M/Cu\text{-}O_2$, 3-16: $(SrO\text{-}(Pb, Cu)O\text{-}SrO)$ or $SrO\text{-}(Pb, Sr)O\text{-}SrO/Cu\text{-}O_2/M/Cu\text{-}O_2/M/Cu\text{-}O_2/La_2O_2/Cu\text{-}O_2/M/Cu\text{-}O_2/M/Cu\text{-}O_2$, 3-17: $(SrO\text{-}Pb, Cu)O\text{-}SrO)$ or $SrO\text{-}(Pb, Sr)O\text{-}SrO/Cu\text{-}O_2/M/Cu\text{-}O_2/M/Cu\text{-}O_2/BaO\text{-}CuO\text{-}BaO/Cu\text{-}O_2/M/Cu\text{-}O_2/ M/Cu\text{-}O_2$, 3-18: $(SrO\text{-}(Pb, Cu)O\text{-}SrO)$ or $SrO\text{-}(Pb, Sr)O\text{-}SrO/Cu\text{-}O_2/M/Cu\text{-}O_2/M/Cu\text{-}O_2/BaO\text{-}CuO\text{-}CuO\text{-}BaO/Cu\text{-}O_2/M/Cu\text{-}O_2 /M/Cu\text{-}O_2$, 3-19: $(SrO\text{-}(Pb, Cu)O\text{-}SrO)$ or $SrO\text{-}(Pb, Sr)O\text{-}SrO/Cu\text{-}O_2/M/Cu\text{-}O_2/M/Cu\text{-}O_2/SrO\text{-}Bi_2O_2\text{-}SrO/Cu\text{-}O_2 /M/Cu\text{-}O_2/M/Cu\text{-}O_2$, 3-20: $(SrO\text{-}(Pb, Cu)O\text{-}SrO)$ or $SrO\text{-}(Pb, Sr)O\text{-}SrO/Cu\text{-}O_2/M/Cu\text{-}O_2/M/Cu\text{-}O_2/(BaO\text{-}Tl_2O_2\text{-}BaO)$ or $(BaO\text{-}TlO\text{-}BaO)/Cu\text{-}O_2/M/Cu\text{-}O_2/M/Cu\text{-}O_2$, 3-21: $(SrO\text{-}(Pb, Cu)O\text{-}SrO)$ or $SrO\text{-}(Pb, Sr)O\text{-}SrO/Cu\text{-}O_2/M/Cu\text{-}O_2/M/Cu\text{-}O_2/SrO\text{-}PbO\text{-}Cu\text{-}PbO\text{-}SrO/Cu\text{-}O_2/M/Cu\text{-}O_2/M/Cu\text{-}O_2$, 3-22: $Ln_2O_2/Cu\text{-}O_2/M/Cu\text{-}O_2/M/Cu\text{-}O_2/La_2O_2/Cu\text{-}O_2/M/Cu\text{-}O_2/M/Cu\text{-}O_2$, 3-23: $Ln_2O_2/Cu\text{-}O_2/M/Cu\text{-}O_2/M/Cu\text{-}O_2/BaO\text{-}CuO\text{-}BaO/Cu\text{-}O_2/M/Cu\text{-}O_2/M/Cu\text{-}O_2$, 3-24: $Ln_2O_2/Cu\text{-}O_2/M/Cu\text{-}O_2/M/Cu\text{-}O_2/BaO\text{-}CuO\text{-}CnO\text{-}BaO/Cu\text{-}O_2/M/Cu\text{-}O_2/M/Cu\text{-}O_2$, 3-25: $Ln_2O_2/Cu\text{-}O_2/M/Cu\text{-}O_2/M/Cu\text{-}O_2/SrO\text{-}Bi_2O_2\text{-}SrO/Cu\text{-}O_2/M/Cu\text{-}O_2/M/Cu\text{ -}O_2$, 3-26: $Ln_2O_2/Cu\text{-}O_2/M/Cu\text{-}O_2/M/Cu\text{-}O_2/(BaO\text{-}Tl_2O_2\text{-}BaO)$ or $(BaO\text{-}TlO\text{-}BaO)/Cu\text{-}O_2/M/Cu\text{-}O_2/M/Cu\text{-}O_2$, 3-27: $Ln_2O_2/Cu\text{-}O_2/M/Cu\text{-}O_2/M/Cu\text{-}O_2/SrO\text{-}PbO\text{-}Cu\text{-}PbO\text{-}SrO/Cu\text{-}O_2/M/Cu\text{-}O_2/M/Cu\text{-}O_2$, 3-28: $Ln_2O_2/Cu\text{-}O_2/M/Cu\text{-}O_2/M/Cu\text{-}O_2/(SrO\text{-}(Pb, Cu)O\text{-}SrO)$ or $SrO\text{-}(Pb, Sr)O\text{-}SrO/Cu\text{-}O_2/M/Cu\text{-}O_2$.

The oxide superconductor of the present invention can be prepared by various methods.

For example, the superconductor can be prepared by the well-known powder mixing method. Preferably, it may be prepared by various deposition methods capable of deposition control of elements on atomic order, such as the electron beam deposition method, laser deposition method, etc., or various sputtering methods, such as the magnetron sputtering method. Also, it may be prepared by the chemical vapor deposition method using halides, organic metals, etc., atomization method using nitrates, organic acids, or application method using alcoxides and the like.

If the total pressure of the atmosphere during the manufacture is 1 atm. or less, as in the cases of the electron beam deposition, laser deposition, magnetron sputtering, chemical vapor deposition method, etc., the oxygen deficiency in the superconductor can be covered as aforesaid by mixing ozone with the atmosphere.

Among these manufacturing methods, the laser deposition method in the oxygen atmosphere is particularly preferable, since layers of intended compositions can be formed by deposition under fine control according to this method.

This laser deposition method is described in, for example, "Japanese Journal of Applied Physics", vol. 27, No. 7, July, 1988, pp. L1293 to L1296, or "Appl. Phys. Lett.", vol. 54, No. 18, May, 1989, pp. 1802 to 1804, and "Appl. Phys. Lett.", vol. 57, No. 2, July 9, 1990, pp. 198 to 200.

In general, the oxide superconductors of the present invention are prepared by the laser deposition method as follows.

First, an intended crystal structure is designed, and the respective compositions of the first and second blocking layers are selected. Then, sintered bodies having the respective compositions of the individual blocking layers are prepared. Also, a sintered body of Cu or $Cu_2$(sic) and the elements for the mediating layers are prepared for the superconducting layers.

In the case of the one-layer system oxide superconductor, it is necessary only that sintered bodies for the individual blocking layers and a sintered body of Cu or $CuO_2$ (sic) are prepared. In the cases of the two- and three-layer system oxide superconductors, moreover, sintered bodies containing $CuO_2$(sic) and the elements for the mediating layers in a desired ratio may be prepared for the superconducting materials.

These individual sintered bodies are separately located in a chamber to be used as targets, and a single crystal substrate of, e.g., MgO (100), heated up to a desired temperature, are opposed to the targets. In this state, the chamber is loaded with an oxygen atmosphere having a desired oxygen partial pressure, and a pulsed excimer laser with a desired intensity is applied to the targets.

At this time, the laser is applied in the order of the target for the first blocking layer, target for a superconducting layer, target for the second blocking layer, target for another superconducting layer, . . . .

As a result, a film including repeated units each composed of the first blocking layer, superconducting layer, second blocking layer, and superconducting layer is formed on the surface of the single crystal substrate. Thereafter, the obtained film is subjected to heat treatment under the desired oxygen partial pressure, as mentioned before, so that carrier concentration is adjusted, whereby the superconductor is obtained.

In order to form this crystal structure, the repeated units should be electrically neutral. This is because if the electric charge of the whole repeated units is not neutral, the bulk body having crystal structure cannot grow.

If each layer is formed on the basis of a designed crystal structure, the repeated units obtained are not always electrically neutral, and have a positive or negative electric charge as a whole. This can be estimated beforehand from the electric charges of the aforesaid constituent elements.

Table 1 shows the results of calculation of the respective electric charges of repeated units (Case 1) of a one-layer system oxide superconductor and a two- or three-layer system oxide superconductor whose mediating layers are formed of Ca, repeated units (Case 2) of a two-layer system oxide superconductor whose mediating layers are formed of Y, and repeated units (Case 3) of a three-layer system oxide superconductor whose mediating layers are formed of Y.

TABLE 1

| No. | Case 1 | Case 2 | Case 3 |
|-----|--------|--------|--------|
| 1 | −1 | +1 | +3 |
| 2 | −2 | 0 | +2 |
| 3 | −3 | −1 | +1 |
| 4 | 0 | +2 | +4 |
| 5 | −1 | +1 | +3 |
| 6 | −2 | 0 | +2 |
| 7 | 0 or −1 | +2 or −1 | +4 or +3 |
| 8 | −1 or −2 | +1 or 0 | +3 or +2 |
| 9 | −2 or −3 | 0 or −1 | +2 or +1 |
| 10 | 0 or −1 | +2 or +1 | +4 or +3 |
| 11 | −1 | +1 | +3 |
| 12 | −2 | 0 | +2 |
| 13 | −3 | −1 | +1 |
| 14 | −1 | +1 | +3 |
| 15 | −1 or −2 | +1 or 0 | +3 or +2 |
| 16 | −2 | 0 | +2 |
| 17 | −3 | −1 | +1 |
| 18 | −4 | −2 | 0 |
| 19 | −2 | 0 | +2 |
| 20 | −2 or −3 | 0 or −1 | +2 or +1 |
| 21 | −3 | −1 | +1 |

Based on this table, therefore, partial substitution of the constituent elements of the mediating layers or other elements in the composition constituting each blocking layer can be adopted, and the target composition can be selected so that the electric charge of the whole repeated units is 0.

In preparing a repeated unit No. 7 of Case 3, for example, the electric charge of the whole repeated unit can be decreased to 0 by substitution +3-valent Y for +2-valent Ca which form meditating layer.

Whether or not the material thus obtained is superconductive can be determined by cooling this material to a very low temperature and measuring its electrical resistance or magnetic susceptibility.

Even at room temperature, however, it can be analyzed by the method mentioned below. The following is a description of this method.

The optical properties of obtained samples are measured under predetermined conditions by means of a spectroellipsometry, whereupon a real part $\epsilon_1$ and an imaginary part $\epsilon_2$ of a complex dielectric function given by $\epsilon^* = \epsilon_1 + \epsilon_2 i$ (i: imaginary unit) are simultaneously obtained.

The respective values of the real and imaginary parts $\epsilon_1$ and $\epsilon_2$ are plotted with respect to the measurement wave-number, and whether or not the value of the real part $\epsilon_1$ passes zero on the resulting curve is read. If the value of the real part $\epsilon_1$ for material passes zero, then the material is superconducting.

Then, a reciprocal function $a^* (=1/\epsilon^*)$ of the aforesaid complex dielectric function $\epsilon^*$ is calculated. In this case, this reciprocal function is also a complex function, which is given by $a^* = a_1 + a_2 i$ (i: imaginary).

The respective values of real and imaginary pares $a_1$ and $a_2$ of the reciprocal function $a^*$ are plotted with respect to the aforesaid measurement wave-number. A curve representing the imaginary part $a_2$ for a superconductive material has a clear peak at almost; the same wave-number which gives $\epsilon_1 = 0$ in the aforesaid complex dielectric function. For a material which is not superconducting, no such peak appears, or if any, the peak is shifted to the low-wave-number side, and is broad.

Thus, if the curve representing the real part $\epsilon_1$ of the aforesaid complex dielectric function passes the zero value, and if the curve representing the imaginary part $a_2$ of the reciprocal function of the complex dielectric function has its peak value at almost the same wave-number for $\epsilon_1 = 0$, then the material is judged to be superconducting.

For example, an oxide superconductor A, which has a composition expressed as $Bi_2Sr_2CaCu_2O_y$ and $Tc = 85$ K, and a non-superconducting material B, which has a composition expressed as $Bi_2Sr_2CuO_2$ and is not superconducting unless $Tc = 0$ K is obtained, were prepared, and the respective complex dielectric functions of these materials were measured under the following conditions by using a phase difference measuring apparatus (NPDM-1000 from Nippon Kogaku K.K.).

Spectroscope: M-70,
Light source: Halogen lamp,
Sensor: Si and Ge,
Polarizer and analyzer: Gran-Thomson
Number of revolutions of analyzer: 2,
Angie of incidence: 80°,
Measurement wave-number: 7,000 to 25,000 cm$^{-1}$, FIG. 7 shows the relationships between the real and imaginary parts $\epsilon_1$ and $\epsilon_2$ of the complex dielectric function $\epsilon^*$ of the material A and the measurement wave-number, and FIG. 8 shows the relationships between the real and imaginary parts $a_1$ and $a_2$ of the reciprocal function $a^*$ of the complex dielectric function $\epsilon^*$ of the material A and the measurement wave-number. In this drawing, open circles and closed circles represent the real and imaginary parts, respectively.

As seen from FIG. 7, the curve representing the real part $\epsilon_1$ passes the zero value when the wave-number is nearly 8,100 cm$^{-1}$. As seen from FIG. 8, moreover, the curve representing the imaginary part $a_2$ has its peak value when the wave-number is nearly 8,100 cm$^{-1}$.

On the other hand, FIG. 9 shows the relationships between-the real and imaginary parts $\epsilon_1$ and $\epsilon_2$ of the complex dielectric function $\epsilon^*$ of the material B and the measurement wave-number, and FIG. 10 shows the relationships between the real and imaginary parts $a_1$ and $a_2$ of the reciprocal function $a^*$ of the complex dielectric function $\epsilon^*$ of the material B and the measurement wave-number. In this drawing, open circles and closed circles represent the real and imaginary parts, respectively.

In the case of the material B, as seen from FIG. 9, the real part $\epsilon_1$ of the complex dielectric function takes the zero value when the wave-number is nearly 14,500 cm$^{-1}$. As seen from FIG. 10, however, the curve representing the imaginary part $a_2$ has no such distinct peak as FIG. 8 shows in the vicinity of 14,500 cm$^{-1}$. As seen from FIG. 10, moreover, the imaginary part $a_2$ has a gentle peak in the vicinity of 8,000 cm$^{-1}$. In FIG. 9, however, $\epsilon_1$ does not take t;he zero value in the vicinity of 8,000 cm$^{-1}$.

BRIEF DESCRIPTION OF THE DRAWINGS

FIG. 26 is an X-ray diffraction pattern diagram of the oxide superconductor of Embodiment 27;

DETAILED DESCRIPTION OF THE PREFERRED EMBODIMENTS

Embodiment 1

Figure 1:
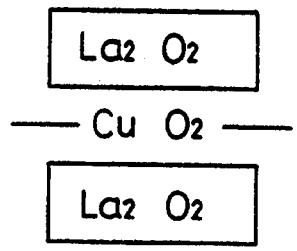
FIG. 1 is a conceptual diagram of a conventional $La_2CuO_4$ superconductor.
Figure 2:
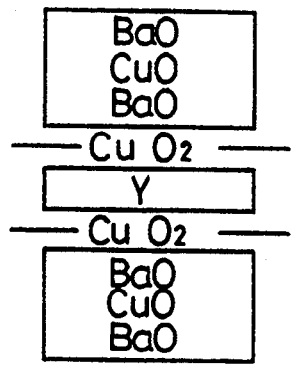
FIG. 2 is a conceptual diagram of a conventional $Y_1Ba_2Cu_3O_7$ superconductor.
Figure 3:
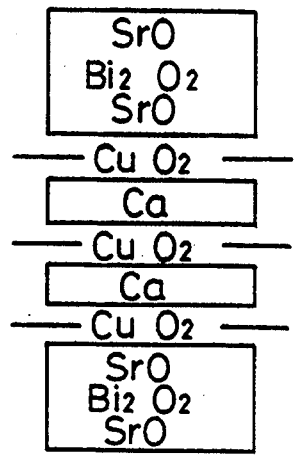
FIG. 3 is a conceptual diagram of a conventional $Bi_2Sr_2Ca_2Cu_3O_{10}$ superconductor.
Figure 4:
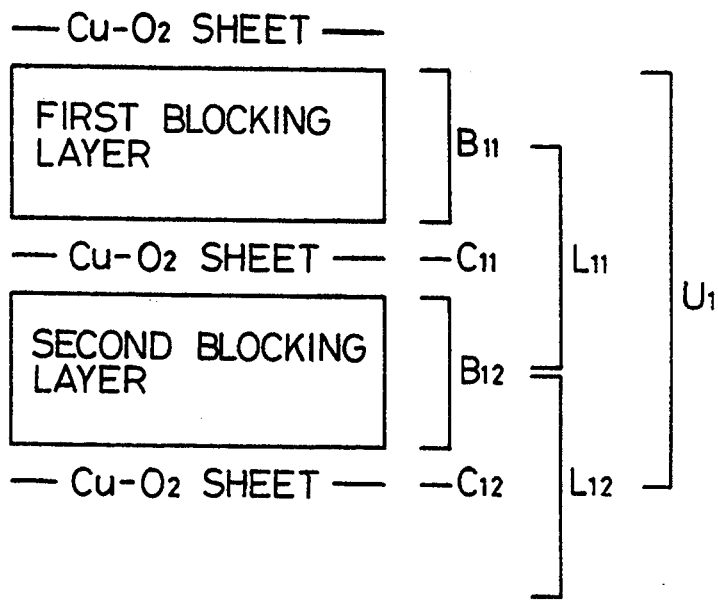
FIG. 4 is a conceptual diagram of a one-layer system oxide superconductor according to the present invention.
Figure 5:
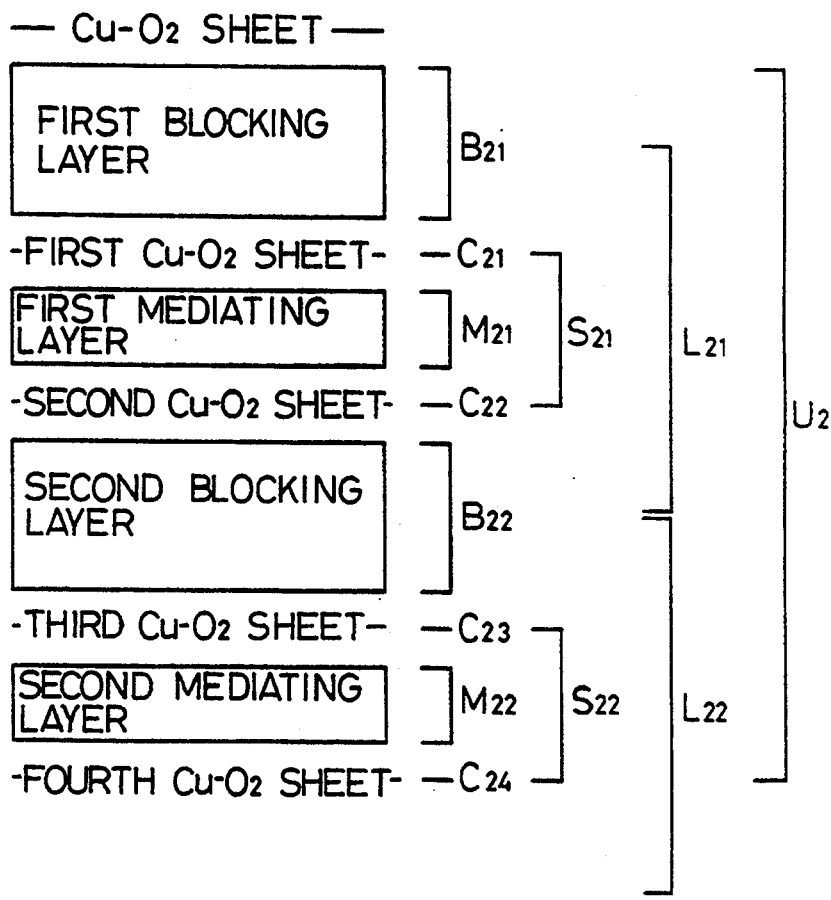
FIG. 5 is a conceptual diagram of a two-layer system oxide superconductor according to the present invention.
Figure 6:
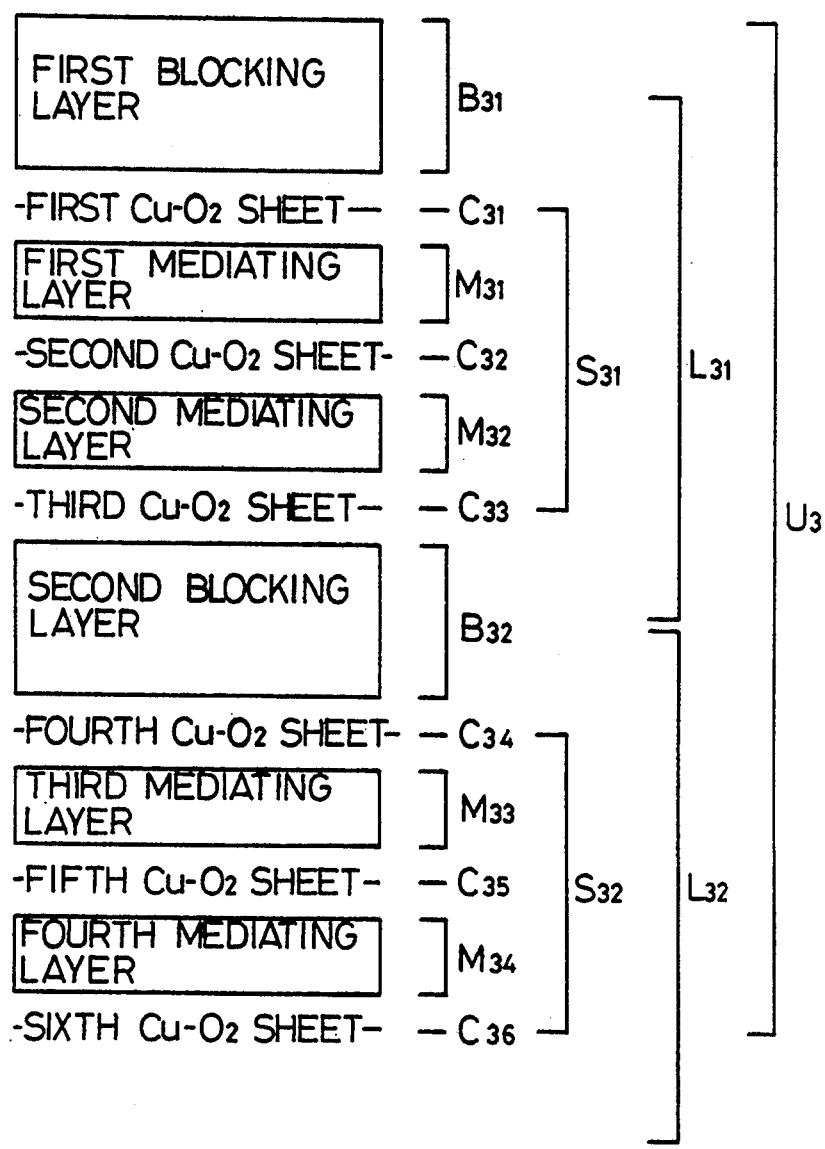
FIG. 6 is a conceptual diagram of a three-layer system oxide superconductor according to the present invention.
Figure 7:
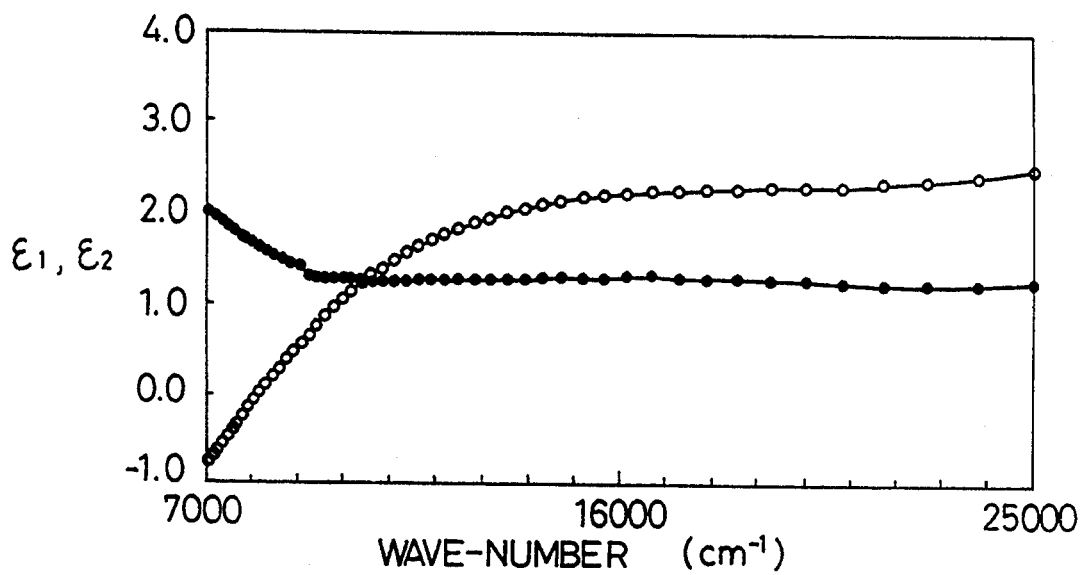
FIG. 7 is a graph showing the relationships between real and imaginary parts $\epsilon 1$ and $\epsilon 2$ of the complex dielectric function of the oxide superconductor and the measurement wave-number.
Figure 8:
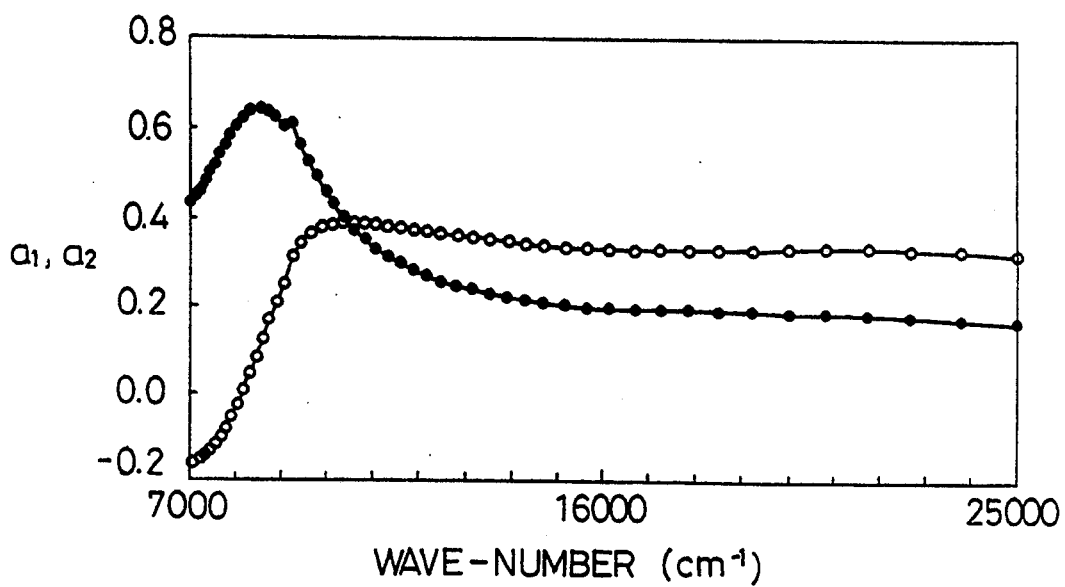
FIG. 8 is a graph showing the relationships between real and imaginary parts $a1$ and $a2$ of kite reciprocal function of the complex dielectric function of the oxide superconductor and measurement wave-number.
Figure 9:
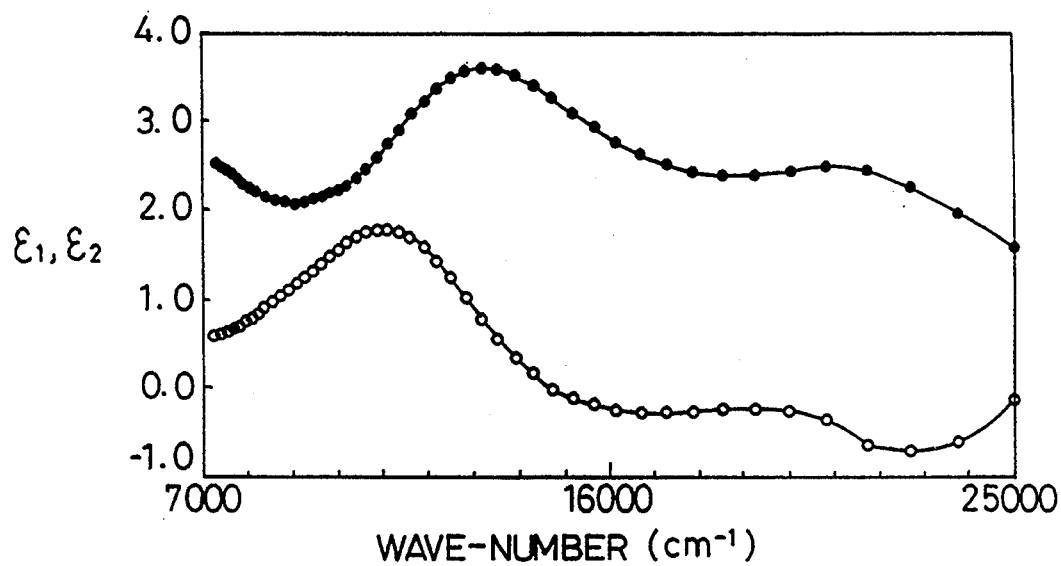
FIG. 9 is a graph showing the relationships between the real and imaginary parts $\epsilon 1$ and $\epsilon 2$ of the complex dielectric function of the non-superconducting oxide material and the measurement wave-number.
Figure 10:
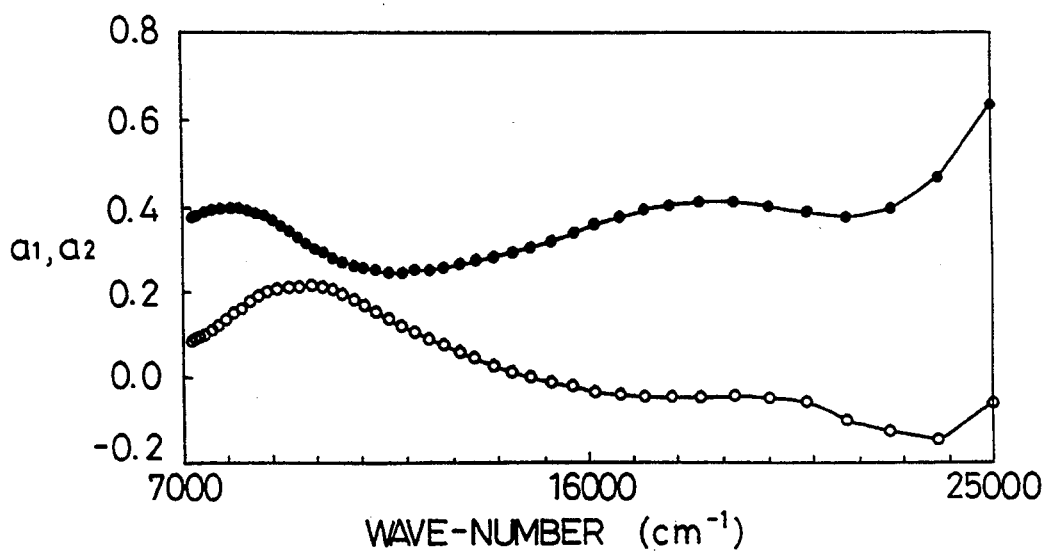
FIG. 10 is a graph showing the relationships between real and imaginary parts $a1$ and $a2$ of the reciprocal function of the complex dielectric function of the non-superconducting oxide material and the measurement wave-number.

Powders of PbO and CuO were weighed so that the molar ratio Pb:Cu was 2:1, and these powders were mixed together. The resulting powder mixture was pressed into pellets at 500 kg/cm², and the resulting pellet was then sintered for 5 hours in air at 800° C.

Composition: A sintered pellet of $Pb_2CuO_x$ was obtained. This will be referred to as sintered body I.

Powders of $SrCO_3$, $La_2(CO_3)_3 \cdot nH_2O$, and CuO were weighed so that the molar ratio Sr:La:Cu was 0.75:0.25:1, and these powders were mixed together. The resulting powder mixture was pressed into pellets at 500 kg/cm², and the resulting pellet was then sintered for 5 hours in air at 900° C.

Composition: A sintered pellet of $Sr_{0.75}La_{0.25}CuO_x$ was obtained. This will be referred to as sintered body II.

Powders of $CaCO_3$, $Y_2O_3$, and CuO were weighed so that the molar ratio Ca:Y:Cu was 0.8:0.2:1, and these powders were mixed together. The resulting powder mixture was pressed into pellets at 500 kg/cm², and the resulting pellet was then sintered for 5 hours air at 900° C.

Composition: A sintered pellet of $Ca_{0.8}Y_{0.2}CuO_x$ was obtained. This will be referred to as sintered body III.

Powders of $La_2(CO_3)_3 \cdot nH_2O$, $BaCO_3$, PbO, and CuO were weighed so that the molar ratio La:Ba:Pb:Cu was 3:0.75:0.5:2, and these powders were mixed together. The resulting powder mixture was pressed into pellets at 500 kg/cm², and the resulting pellet was then sintered for 5 hours in air at 900° C.

Composition: A sintered pellet of $La_3Ba_{0.75}Pb_{0.25}Cu_2O_x$ was obtained. This will be referred to as sintered body IV.

Then, these sintered bodies I, II, III and IV were set individually on target holder which was located in a vacuum chamber, an MgO (100) single crystal substrate was set in a position opposite to these sintered bodies, and this substrate was heated to 600° C.

$O_2$ gas and $N_2O$ gas were introduced into the vacuum chamber, and an excimer laser was applied to the respective targets of the individual sintered bodies with the degree of vacuum in the chamber kept at $5 \times 10^{-4}$ Torr (oxygen partial pressure: $2.5 \times 10^{-4}$ Torr).

The intensity of the laser used was 150 mJ/pulse. The laser was applied to the respective targets of sintered bodies in a manner such that the sintered bodies I, II, III, IV, III and II were irradiated for each cycle in the order named, and this cycle was repeatedly executed.

A film was formed on the MgO substrate. After the film formation, the substrate was cooled at the rate of 20° C./min by introducing oxygen gas containing 8% by volume of ozone into the chamber at the flow rate of 25 ml/min.

The general composition of the film obtained was $(Pb_{0.5}Cu_{0.5})$ $(Sr_{0.75}La_{0.25})_2(La_{0.75}Ba_{0.19}Pb_{0.06})_2$ $(Ca_{0.8}Y_{0.2})_2Cu_5O_{13.2}$. When an X-ray diffraction spectrum was observed, the crystal structure of the film proved to be identical with that of the aforementioned Model No. 2-16.

Subsequently, real and imaginary parts $\epsilon 1$ and $\epsilon 2$ of the complex dielectric function of this film were measured at room temperature by the aforesaid spectroellipsometry. Thereupon, the value $\epsilon 1$ proved to be zero when the measurement wave-number was about 9,500 cm$^{-1}$, and also, a peak was observed in a curve of an imaginary part a2 of a reciprocal function when the wave-number was about 9,500 cm$^{-1}$.

Thus, it was confirmed that this film is a two-layer system oxide superconductor as it is called according to the present invention.

Embodiments 2 to 35

Sintered bodies of various compositions shown in Tables 2-(1) and 2-(2) were manufactured by the powder mixing method in the same manner as in the case of Embodiment 1.

TABLE 2

| | Type of Sintered Body (Target) | | | |
|---|---|---|---|---|
| | I | II | III | IV |
| Embodiment 2 | La $Ba_{0.75}$ $Pb_{0.5}O_x$ | Cu $O_2$ | $Ba_{1.9}La_{0.1}Cu$ $O_x$ | — |
| Embodiment 3 | $Bi_{1.6}Pb_{0.8}O_x$ | Sr Cu $O_x$ | $La_{1.6}Ba_{0.2}Pb_{0.6}Cu$ $O_x$ | — |
| Embodiment 4 | $Bi_{1.6}Pb_{0.6}O_x$ | $Sr_{0.7}La_{0.3}Cu$ $O_x$ | $Ba_{1.8}La_{0.2}Cu$ $O_x$ | — |
| Embodiment 5 | $Bi_{1.6}Pb_{0.6}O_x$ | $Sr_{0.7}La_{0.3}Cu$ $O_x$ | $Ba_{1.7}La_{0.3}Cu_2O_x$ | — |
| Embodiment 6 | $Tl_{0.8}$ $Pb_{0.4}O_x$ | Ba $Cu_{1.1}O_x$ | $La_{1.8}Ba_{0.2}Cu$ $O_x$ | — |
| Embodiment 7 | $Tl_{0.8}$ $Pb_{0.4}O_x$ | Ba Sr $Cu_{1.1}O_x$ | $Bi_{1.6}Pb_{0.6}O_x$ | — |
| Embodiment 8 | $Pb_3Cu$ $O_x$ | Sr Ba Cu $O_x$ | $Tl_{0.8}$ $Pb_{0.4}O_x$ | — |
| Embodiment 9 | $Pb_{0.8}Sr_{0.5}La_{0.5}Cu_{1.5}O_x$ | Cu $O_x$ | $La_{1.8}Ba_{0.2}Cu$ $O_x$ | — |
| Embodiment 10 | $Pb_{1.0}Sr_{0.5}La_{0.5}Cu_2O_x$ | $Ba_2Cu$ $O_x$ | — | — |
| Embodiment 11 | $Bi_2O_x$ | Sr La Cu $O_x$ | $Pb_{0.5}Cu_{0.5}O_x$ | — |
| Embodiment 12 | $La_{1.4}Ba_{0.4}Pb_{0.6}Cu$ $O_x$ | $Ca_{0.7}Y_{0.3}$ Cu $O_x$ | $Ba_{1.8}$ $La_{1.2}Cu$ $O_x$ | — |
| Embodiment 13 | $La_{1.8}Ba_{0.2}Pb_{0.3}Cu$ $O_x$ | $Ca_{0.1}Y_{0.9}$ Cu $O_x$ | $Ba_{0.9}La_{0.1}Cu$ $O_x$ | — |
| Embodiment 14 | $Bi_2Sr_{0.9}La_{0.1}Cu$ $O_x$ | $Ca_{0.5}Y_{0.5}$ Cu $O_x$ | $Ba_{1.8}La_{0.2}Cu$ $O_x$ | — |
| Embodiment 15 | $Bi_2Sr_{0.7}La_{0.3}Cu$ $O_x$ | $Ca_{0.8}Y_{0.2}$ Cu $O_x$ | Ba Cu $O_x$ | — |
| Embodiment 16 | $Tl_2$ $Ba_{0.9}La_{0.1}Cu$ $O_x$ | $Ca_{0.9}Ho_{0.1}Cu$ $O_x$ | $Ba_{0.9}La_{0.1}Cu$ $O_x$ | — |
| Embodiment 17 | $tl_{1.5}$ $Sr_{0.9}Ba_{0.05}$ $La_{0.05}$ Cu $O_x$ | $Ca_{0.95}$ $Y_{0.05}Cu$ $O_x$ | $Ba_{0.9}Sr_{0.1}Cu$ $O_x$ | — |
| Embodiment 18 | $Pb_3Cu$ $O_x$ | $Sr_{0.7}La_{0.3}Cu$ $O_x$ | $Ca_{0.9}Nd_{0.1}Cu$ $O_x$ | $La_{1.8}Ba_{0.2}Cu$ $O_x$ |
| Embodiment 19 | $Pb_{0.5}Cu_{0.5}O_x$ | $Sr_{0.5}La_{0.5}Cu$ $O_x$ | $Ca_{0.8}Y_{0.2}$ Cu $O_x$ | $Bi_2Sr$ La Cu $O_x$ |
| Embodiment 20 | $La_{1.8}Ba_{0.2}Cu$ $O_x$ | $Ca_{0.9}Sr_{0.1}Cu$ $O_x$ | $Nd_{1.6}Ce_{0.4}Cu$ $O_x$ | — |
| Embodiment 21 | $Ba_{1.8}La_2$ $Cu_2O_x$ | $Ca_{0.8}Gd_{0.2}Cu$ $O_x$ | $Nd_{1.6}Ce_{0.4}Cu$ $O_x$ | — |
| Embodiment 22 | Bi Sr Cu $O_x$ | Ca Cu $O_x$ | $Nd_{1.6}Ce_{0.4}Cu$ $O_x$ | — |
| Embodiment 23 | $Tl_2$ $Ba_{0.8}La_{0.2}Cu$ $O_x$ | $Ca_{0.95}$ $Sr_{0.05}$ Cu $O_x$ | $Eu_{1.6}Ce_{0.4}Cu$ $O_x$ | — |
| Embodiment 24 | Pb Cu $Sr_{1.6}La_{0.4}Cu_2O_x$ | $Ca_{0.8}Er_{0.2}Cu$ $O_x$ | $Gd_{1.6}Ce_{0.4}Cu$ $O_x$ | — |
| Embodiment 25 | $La_{0.8}Ba_{0.1}Pb_{0.3}Cu$ $O_x$ | $Ca_{0.7}Y_{0.3}$ Cu $O_x$ | $Ba_{1.8}Sr_{0.2}Cu_2O_x$ | — |
| Embodiment 26 | $La_{0.8}Ba_{0.1}Pb_{0.3}Cu$ $O_x$ | $Ca_{0.7}Y_{0.3}$ Cu $O_x$ | $Ba_{0.9}Sr_{0.1}Cu_3O_x$ | — |
| Embodiment 27 | $Bi_2O_x$ | $Sr_{0.7}La_{0.3}Cu$ $O_x$ | $Ca_{0.9}Y_{0.1}$ Cu $O_x$ | $Ba_{1.9}La_{0.1}Cu_3O_x$ |
| Embodiment 28 | $Bi_2O_x$ | $Sr_{0.9}La_{0.1}Cu$ $O_x$ | $Ca_{0.9}Y_{0.1}$ Cu $O_x$ | $Ba_{1.9}La_{0.1}Cu_3O_x$ |
| Embodiment 29 | $TlO_x$ | $Ba_{0.9}Sr_{0.1}Cu$ $O_x$ | $Ca_{0.95}$ $Ho_{0.05}$ Cu $O_x$ | $Ba_{1.9}La_{0.1}Cu_3O_x$ |
| Embodiment 30 | $Bi_{1.6}Pb_{0.8}Sr_{1.7}La_{0.2}Cu_2O_x$ | $Ca_{0.9}Y_{0.1}$ Cu $O_x$ | $Tl_{3.2}Ba_2Cu_2O_x$ | — |
| Embodiment 31 | $Pb_{2.5}Sr_{1.4}La_{0.7}Cu_2O_x$ | $Ca_{0.5}Sm_{0.5}Cu$ $O_x$ | $Bi_2Sr_{1.4}La_{0.6}Cu_2O_x$ | — |
| Embodiment 32 | $Pb_{0.8}Cu_{1.5}Sr_{0.5}La_{0.5}O_x$ | $Ca_{0.7}Y_{0.3}$ Cu $O_x$ | $TlBa_2Cu$ $O_x$ | — |
| Embodiment 33 | $Ba_{1.9}La_{0.1}Cu_3O_x$ | $Ca_{0.1}Gd_{0.9}Cu$ $O_x$ | $Nd_{1.6}Ce_{0.4}Cu$ $O_x$ | — |
| Embodiment 34 | $Bi_{1.6}Pb_{0.6}O_x$ | $Sr_{0.95}$ $Ba_{0.05}$ Cu $O_x$ | $Ca_{0.9}Y_{0.1}Cu$ $O_x$ | $Sm_{1.6}Ce_{0.4}Cu$ $O_x$ |
| Embodiment 35 | Pb $Cu_{0.5}O_x$ | $Sr_{0.5}La_{0.5}Cu$ $O_x$ | Ca Cu $O_x$ | $Eu_{1.6}Ce_{0.4}Cu$ $O_x$ |

Then, films were formed on substrates shown in Tables 3-(1) and 3-(2) by the laser deposition method using these sintered bodies as targets, and these films were heat-treated under the oxygen partial pressure in the same manner as in Embodiment 1.

During the film formation, an excimer laser was applied to the targets by repeating the cycles shown in Tables 3-(1) and 3-(2).

Tables 3-(1) and 3-(2) show the respective general compositions of the films obtained, and also show models of crystal structures obtained X-ray diffraction patterns.

A spectroellipsometry measurement was made on each of these films in the same manner as in Embodiment 1. Thereupon, the curve of the real part $\epsilon_1$ of the complex dielectric function $\epsilon_1$ passed the zero value, and a peak was observed in the curve of the imaginary part a2 of its reciprocal function at the wave-number which gave $\epsilon_1 = 0$ in the aforesaid complex dielectric function. Thus, it was confirmed that the films are superconducting materials.

TABLE 3

| | Type of Substrate | General Composition of Film | Cycle of Laser Application to Target | Crystal Structure Model |
|---|---|---|---|---|
| Embodiment 2 | $SrTiO_3$ | $(La, Ba, Pb)_2(Ba, La)_2 Cu_3O_{8.3}$ | I→II→III→II→ | 1-1 |
| Embodiment 3 | $SrTiO_3$ | $(Bi, Pb)_2 Sr_2La_2Cu_2O_{10}$ | II→III→II→I→ | 1-4 |
| Embodiment 4 | $SrTiO_3$ | $(Bi, Pb)_2 (Sr, La)_2(Ba, La)_2 Cu_3O_{10.8}$ | II→I→II→III→ | 1-5 |
| Embodiment 5 | $LaAlO_3$ | $(Bi, Pb)_2(Sr, La)_2(Ba, La)_2 Cu_4O_{11.7}$ | II→I→II→III→ | 1-6 |
| Embodiment 6 | $MgO$ | $(Tl, Pb)_2 Ba_2La_2Cu_2O_{10}$ | III→II→I→II→ | 1-7 |
| Embodiment 7 | $SrTiO_3$ | $(Tl, Pb)_2(Bi, Pb)_2(Sr, Ba)_2 Sr_2Cu_2O_{12}$ | II→III→II→I→ | 1-10 |
| Embodiment 8 | $MgO$ | $Pb_2 (Sr, Ba)_2 Ba_2 (Tl, Pb)_2 Cu_3O_{12}$ | II→I→II→III→ | 1-15 |
| Embodiment 9 | $SrTiO_3$ | $(Pb, Cu) (Sr, La)_2(La, Ba)_2 Cu_2O_{8.9}$ | I→II→III→II→ | 1-16 |
| Embodiment 10 | $SrTiO_3$ | $(Pb, Cu) (Sr, La)_2 Ba_2Cu_3O_{10.1}$ | I→II→ | 1-17 |
| Embodiment 11 | $SrTiO_3$ | $(Pb, Cu) (Sr, La)_4 Bi_2Cu_2O_{10.9}$ | II→I→II→III→ | 1-19 |
| Embodiment 12 | $LaGaO_3$ | $(La, Ba, Pb)_2(Ba, La)_2(Ca, Y)_2Cu_5O_{12.5}$ | I→II→III→II→ | 2-1 |
| Embodiment 13 | $SrTiO_3$ | $(Ba, La)_2(La, Ba, Pb)_2Ca, Y)_2Cu_6O_{13.5}$ | I→II→III→II→ | 2-2 |
| Embodiment 14 | $NdAlO_3$ | $Bi_2 (Sr, La)_2(Ba, La)_2(Ca, Y)_2Cu_5O_{15}$ | I→II→III→II→ | 2-5 |
| Embodiment 15 | $MgO$ | $Bi_2 (Sr, La)_2 Ba_2 (Ca, Y)_2Cu_6O_{15.7}$ | I→II→III→II→ | 2-6 |
| Embodiment 16 | $SrTiO_3$ | $Tl_2(Ba, La)_4(Ca, Ho)_2 Cu_5O_{13.5}$ | I→II→III→II→ | 2-8 |
| Embodiment 17 | $LaAlO_3$ | $(Tl, Pb) (Sr, La, Ba)_4(Ca, Y)_2Cu_5O_{12.5}$ | III→II→I→II→ | 2-8 |
| Embodiment 18 | $MgO$ | $Pb_2 (Sr, La)_2 La_2 (Ca, Nd)_2 Cu_5O_{14}$ | II→I→II→III→IV→III→ | 2-11 |
| Embodiment 19 | $MgO$ | $(Pb, Cu) (Sr, La)_4 Bi_2 (Ca, Y)_2Cu_4O_{14.8}$ | IV→III→II→I→II→III→ | 2-19 |
| Embodiment 20 | $SrTiO_3$ | $(Nd, Ce)_2 (La, Ba)_2(Ca, Sr)_2 Cu_4O_{12}$ | I→II→III→II→ | 2-22 |
| Embodiment 21 | $SrTiO_3$ | $(Sm, Ce)_2(Ba, La)_2(Ca, Gd)_2 Cu_5O_{13}$ | I→II→III→II→ | 2-23 |
| Embodiment 22 | $SrTiO_3$ | $(Nd, Ce)_2 Sr_2Bi_2Ca_2Cu_4O_{13.6}$ | III→II→I→II→ | 2-25 |
| Embodiment 23 | $MgO$ | $(Eu, Ce)_2(Ba, La)_2 Tl_2(Ca, Sr)_2 Cu_4O_{14}$ | I→II→III→II→ | 2-26 |
| Embodiment 24 | $SrTiO_3$ | $(Gd, Ce)_2(Sr, La)_2(Pb, Cu) (Ca, Er)_2 Cu_4O_{18}$ | I→II→III→II→ | 2-28 |
| Embodiment 25 | $LaGaO_3$ | $(La, Ba, Pb)_2 Ba_2 (Ca, Y)_4Cu_7O_{16.5}$ | I→II→III→II→ | 3-1 |
| Embodiment 26 | $SrTiO_3$ | $(La, Ba, Pb)_2 Ba_2 (Ca, Y)_4Cu_7O_{18.8}$ | I→II→III→II→ | 3-2 |
| Embodiment 27 | $SrTiO_3$ | $Bi_2 (Sr, La)_2(La, Ba)_2(Ca, Y)_4Cu_7O_{18.8}$ | II→I→II→III→IV→III→ | 3-5 |
| Embodiment 28 | $SrTiO_3$ | $Bi_2 (Sr, La)_2(La, Ba)_2(Ca, Y)_4Cu_8O_{20}$ | II→I→II→III→IV→III→ | 3-6 |
| Embodiment 29 | $NdGaO_3$ | $Tl (Ba, Sr, La)_4(kCa, Ho)_4 Cu_8 O_{19}$ | II→I→II→III→IV→III→ | 3-9 |
| Embodiment 30 | $SrTiO_3$ | $(Bi, Pb)_2 Tl_2(Ba, Sr, La)_4(Ca, Y)_4Cu_6O_{20.2}$ | I→II→III→II→ | 3-10 |
| Embodiment 31 | $MgO$ | $Pb_2 (Sr, La)_4 Bi_2 (Ca, Sm)_4 Cu_7O_{20}$ | III→II→I→II→ | 3-14 |
| Embodiment 32 | $MgO$ | $(Pb, Cu) (Sr, La)_2 Ba_2Tl (Ca, Y)_4Cu_6O_{18}$ | I→II→III→II→ | 3-20 |
| Embodiment 33 | $SrTiO_3$ | $(Nd, Ce)_2(Ba, La)_2(Ca, Gd)_4 Cu_8O_{18}$ | III→II→I→II→ | 3-24 |
| Embodiment 34 | $SrTiO_3$ | $(Sm, Ce)_2 Sr_2 (Bi, Pb)_2(Ca, Y)_4Cu_6O_{18}$ | II→I→II→III→IV→III→ | 3-25 |
| Embodiment 35 | $SrTiO_3$ | $(Eu, Ce)_2(Sr, La)_2(Pb, Cu)Ca_4Cu_6O_{16.7}$ | IV→III→II→I→II→III→ | 3-28 |

Among these 34 kinds of superconducting films, Embodiments 2 to 11 were one-layer system oxide superconductors, Embodiments 12 to 24 were two-layer system oxide superconductors, and Embodiments 25 to 35 were three-layer system oxide superconductors.

The following is a description of model figures of the respective typical crystal structures of the one-, two-, and three-layer systems, among these individual superconductors, and X-ray diffraction pattern corresponding individually to the structures.

Figure 11:
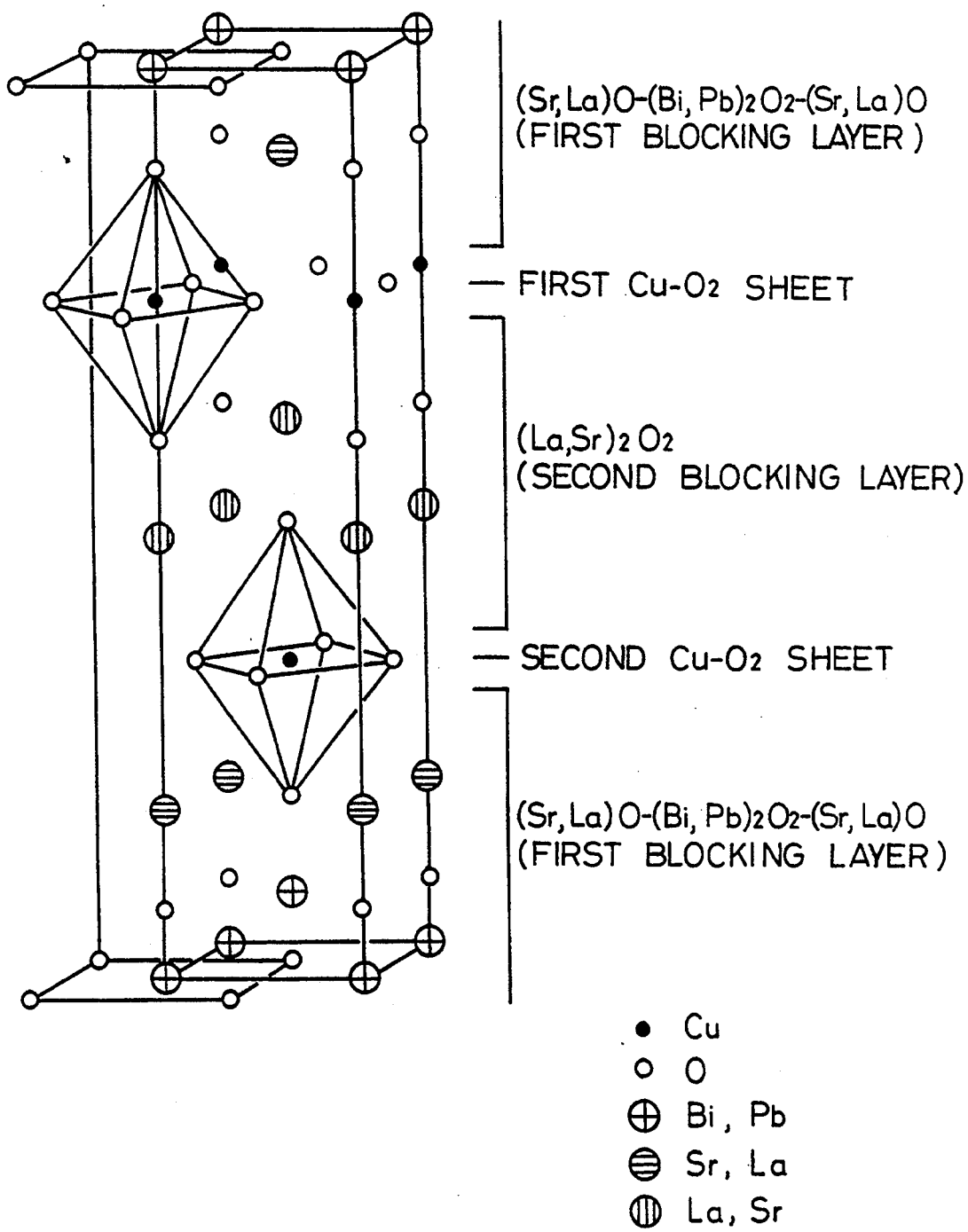
FIG. 11 is a model diagram of a crystal structure (Model 1-4) of Embodiment 3 as a one-layer system oxide superconductor according to the present invention.
Figure 12:
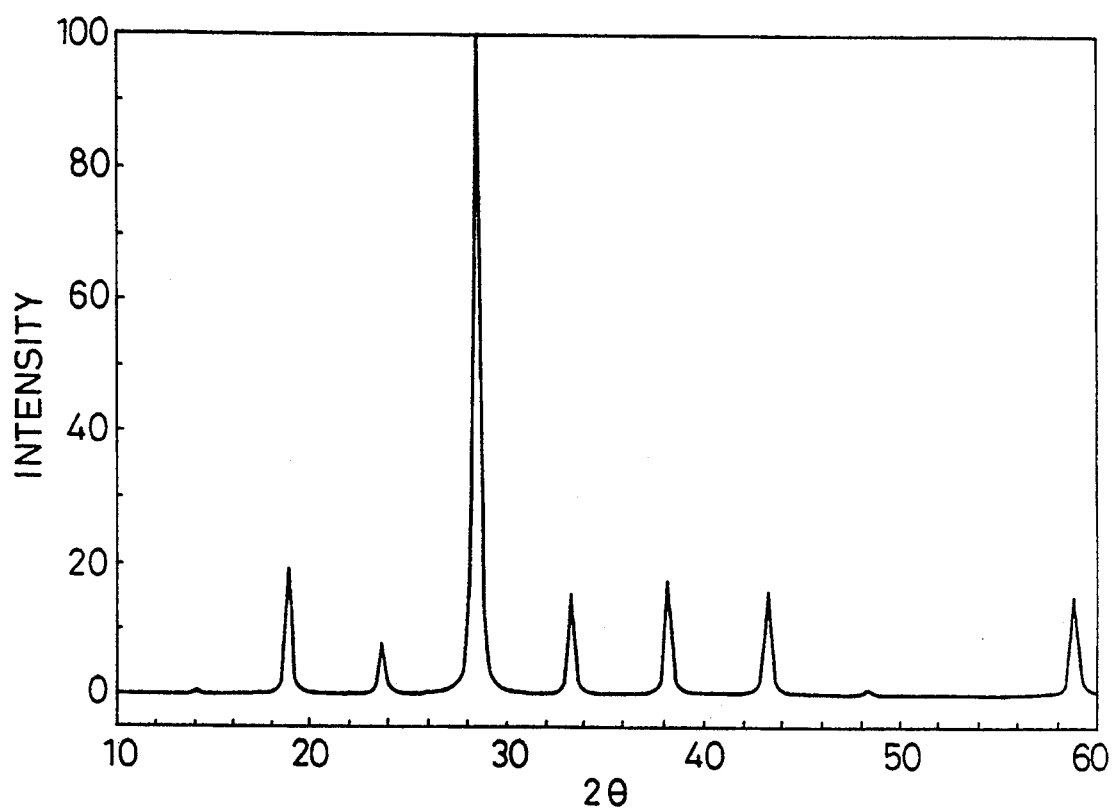
FIG. 12 is an X-ray diffraction pattern diagram of the oxide superconductor of Embodiment 3.
Figure 13:
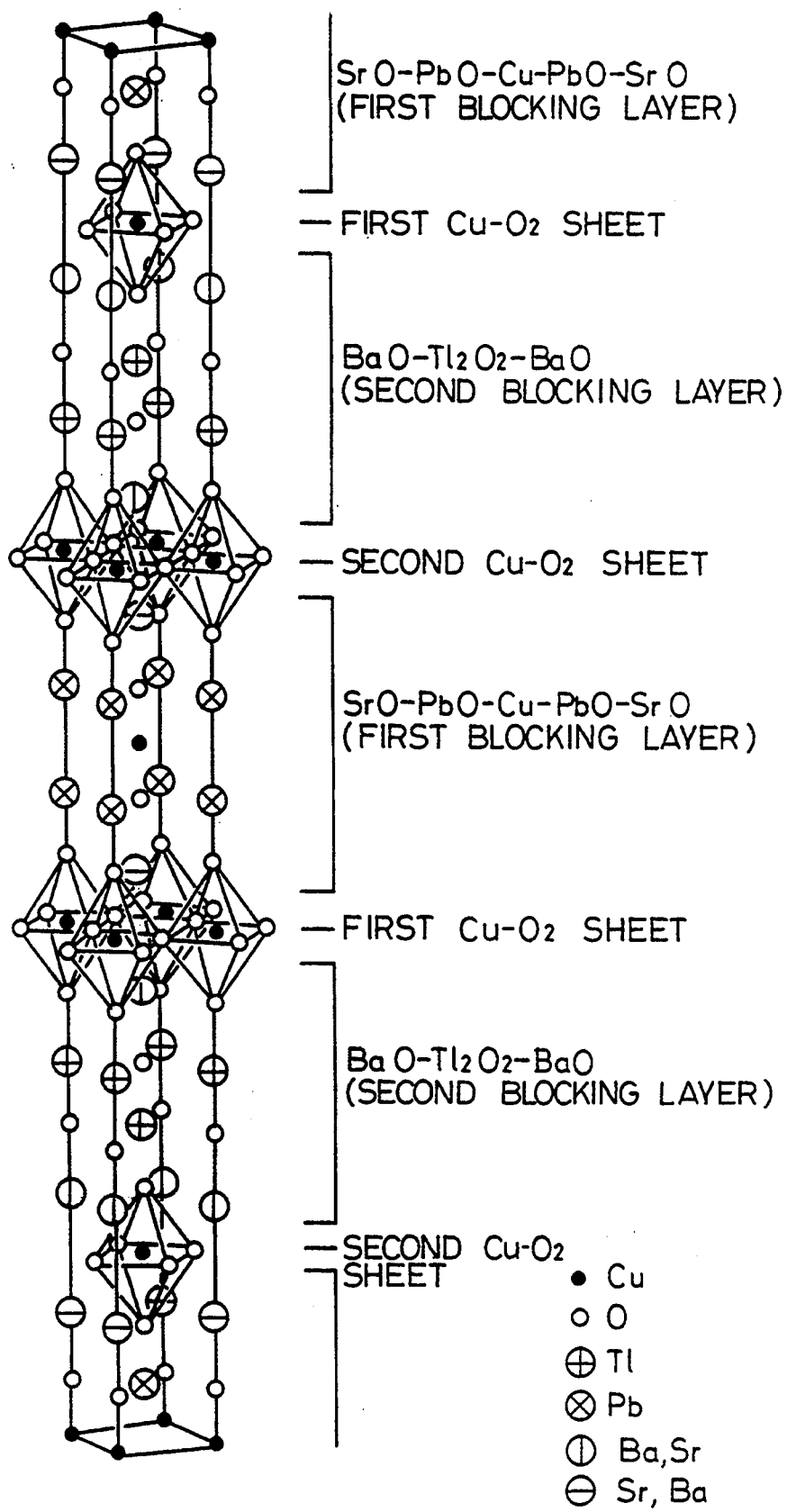
FIG. 13 is a model diagram of a crystal structure (Model 1-15) of Embodiment 8 as a one-layer system oxide superconductor according to the present invention.
Figure 14:
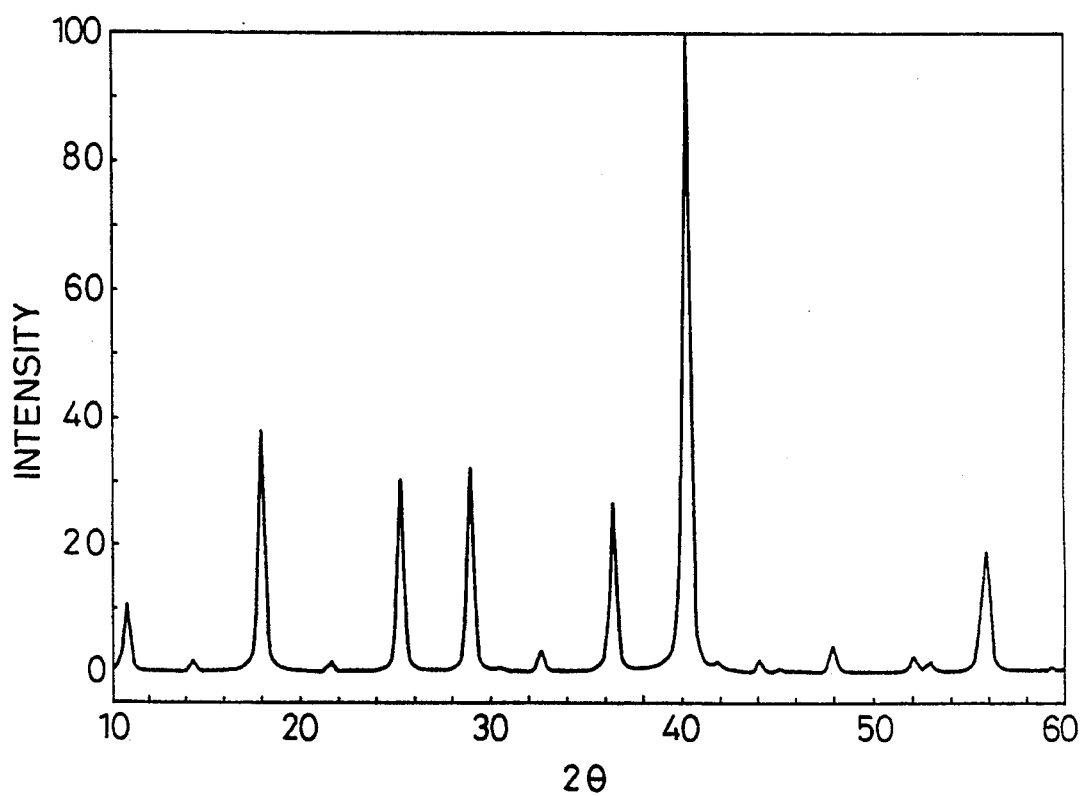
FIG. 14 is an X-ray diffraction pattern diagram of the oxide superconductor of Embodiment 8.
Figure 15:
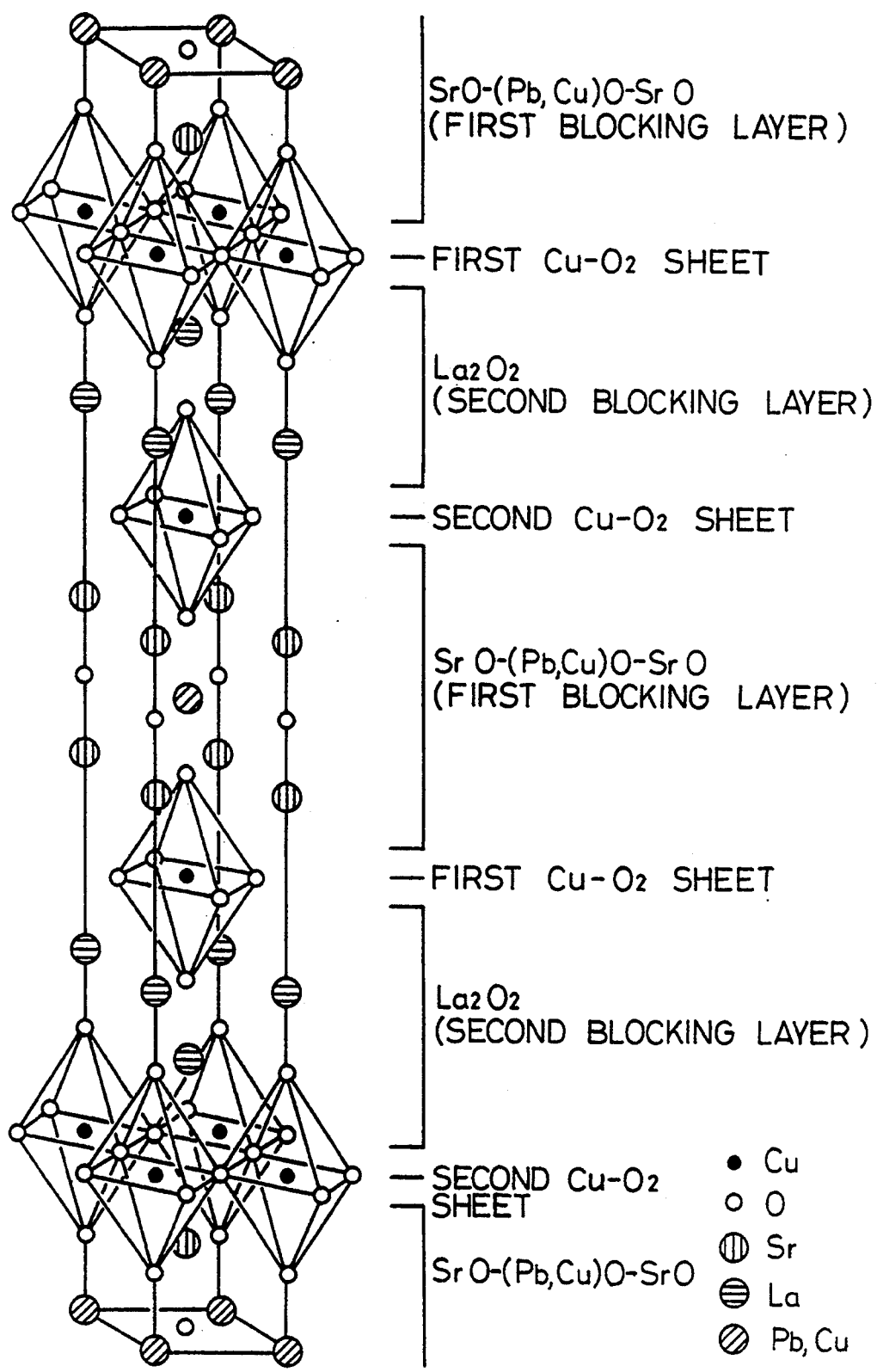
FIG. 15 is a model diagram of a crystal structure (Model 1-16) of Embodiment 9 as a one-layer system oxide superconductor according to the present invention.
Figure 16:
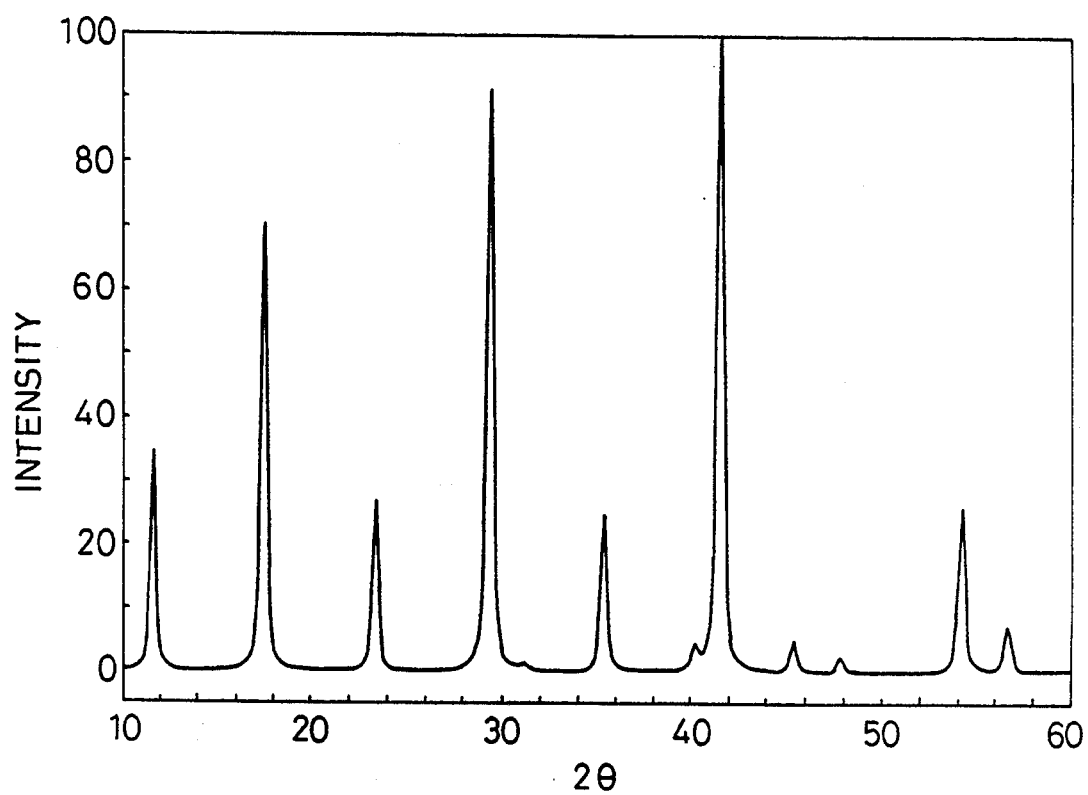
FIG. 16 is an X-ray diffraction pattern diagram of the oxide superconductor of Embodiment 9.
Figure 17:
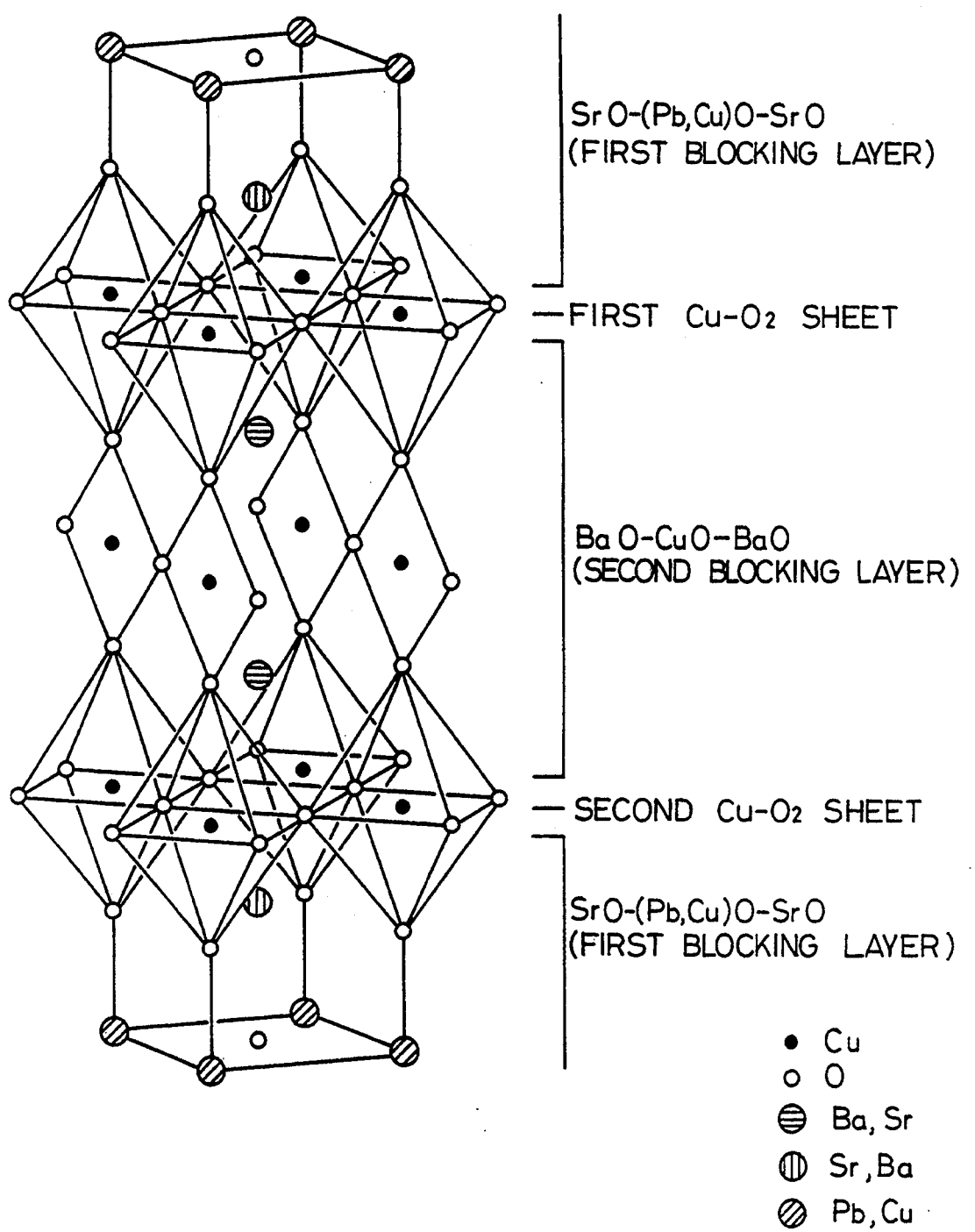
FIG. 17 is a model diagram of a crystal structure (Model 1-17) of Embodiment 10 as a one-layer system oxide superconductor according to the present invention.
Figure 18:
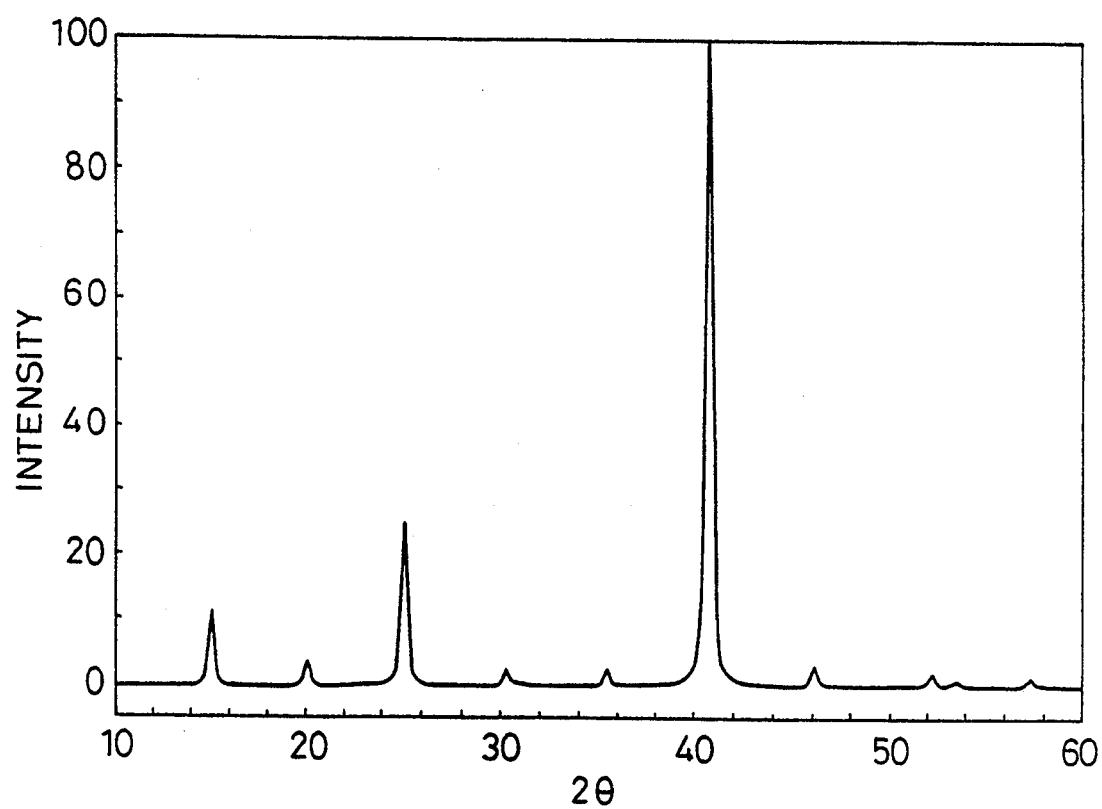
FIG. 18 is an X-ray diffraction pattern diagram of the oxide superconductor of Embodiment 10.

First, FIGS. 11 to 18 show details of the one-layer systems, in which FIGS. 11 and 12 are a model diagram and an X-ray diffraction pattern, respectively, of Embodiment 3 (Model 1-4), FIGS. 13 and 14 are a model diagram and an X-ray diffraction pattern, respectively, of Embodiment 8 (Model 1-1.5). FIGS. 15 and 16 are a model diagram and an X-ray diffraction pattern, respectively, of Embodiment 9 (Model 1-16), and FIGS. 17 and 18 are a model diagram and an X-ray diffraction pattern, respectively, of Embodiment 10 (Model 1-17).

Figure 19:
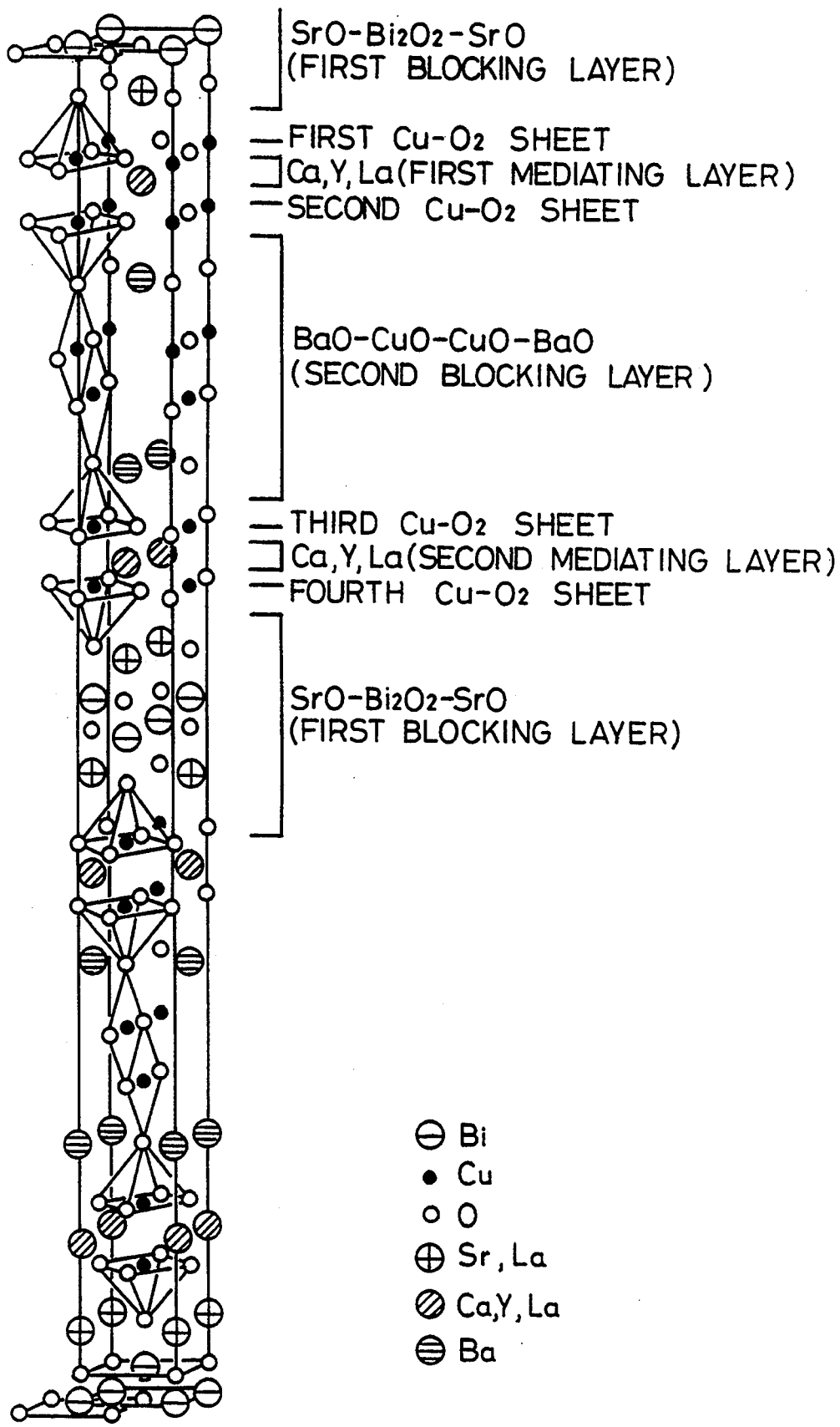
FIG. 19 is a model diagram of a crystal structure (Model 2-6) of Embodiment 15 as a two-layer system oxide superconductor according to the present invention.
Figure 20:
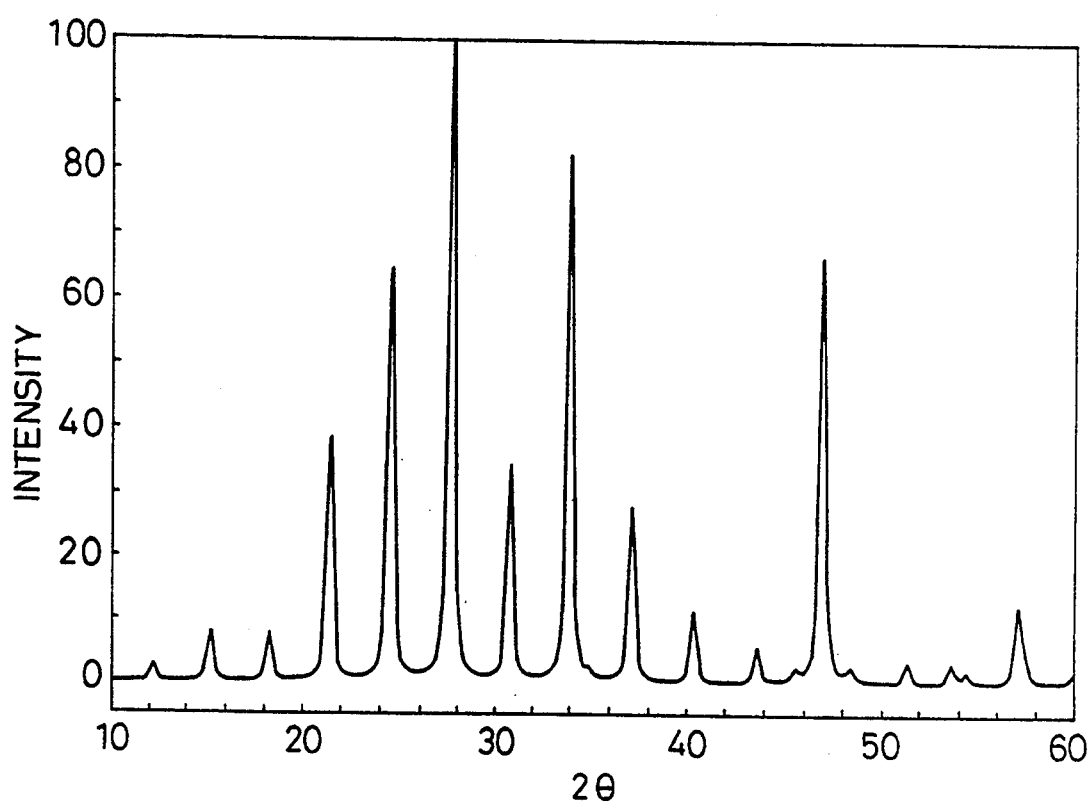
FIG. 20 is an X-ray diffraction pattern diagram of the oxide superconductor of Embodiment 15.
Figure 21:
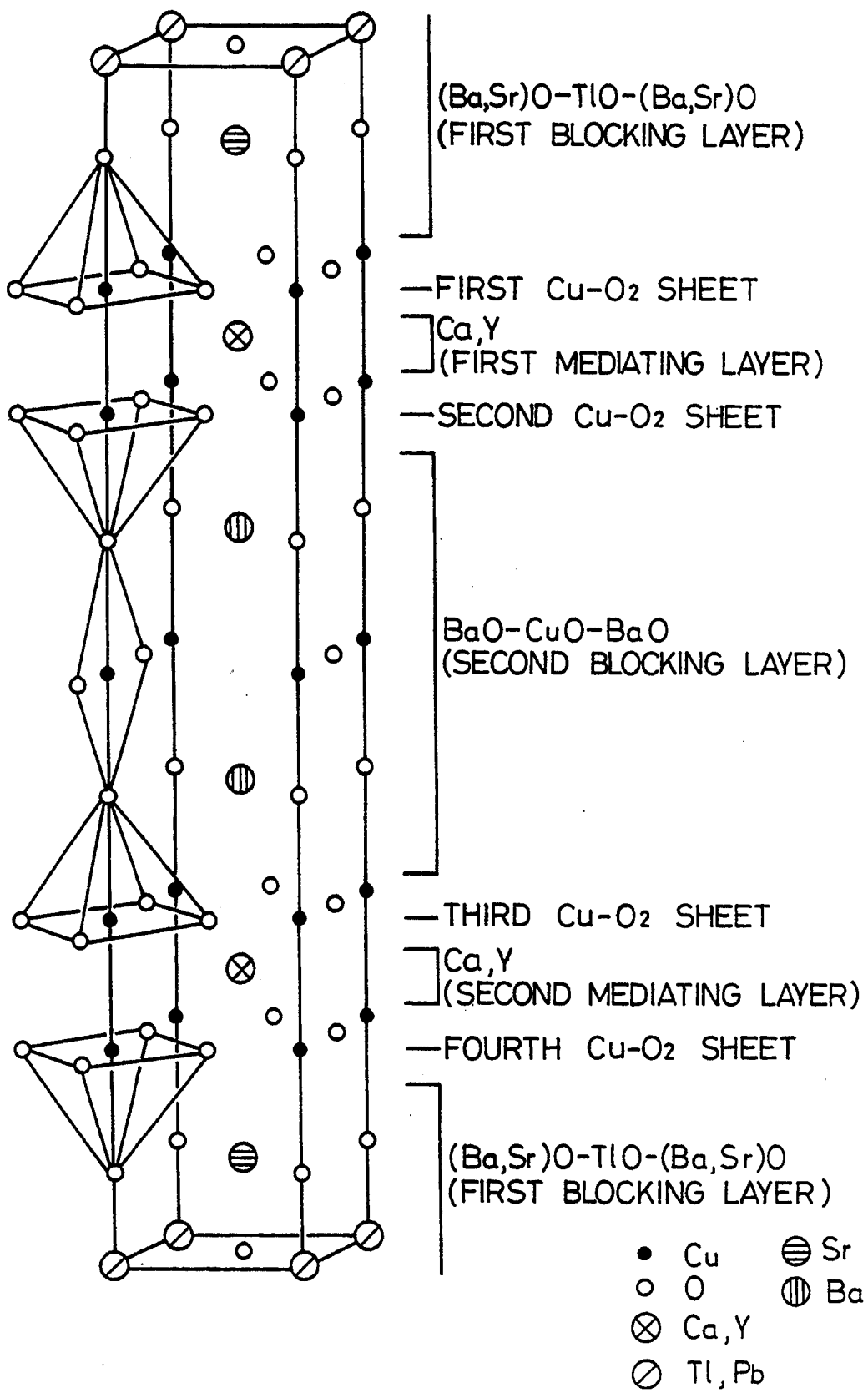
FIG. 21 is a model diagram of a crystal structure (Model 2-8) of Embodiment 17 as a two-layer system oxide superconductor according to the present invention.
Figure 22:
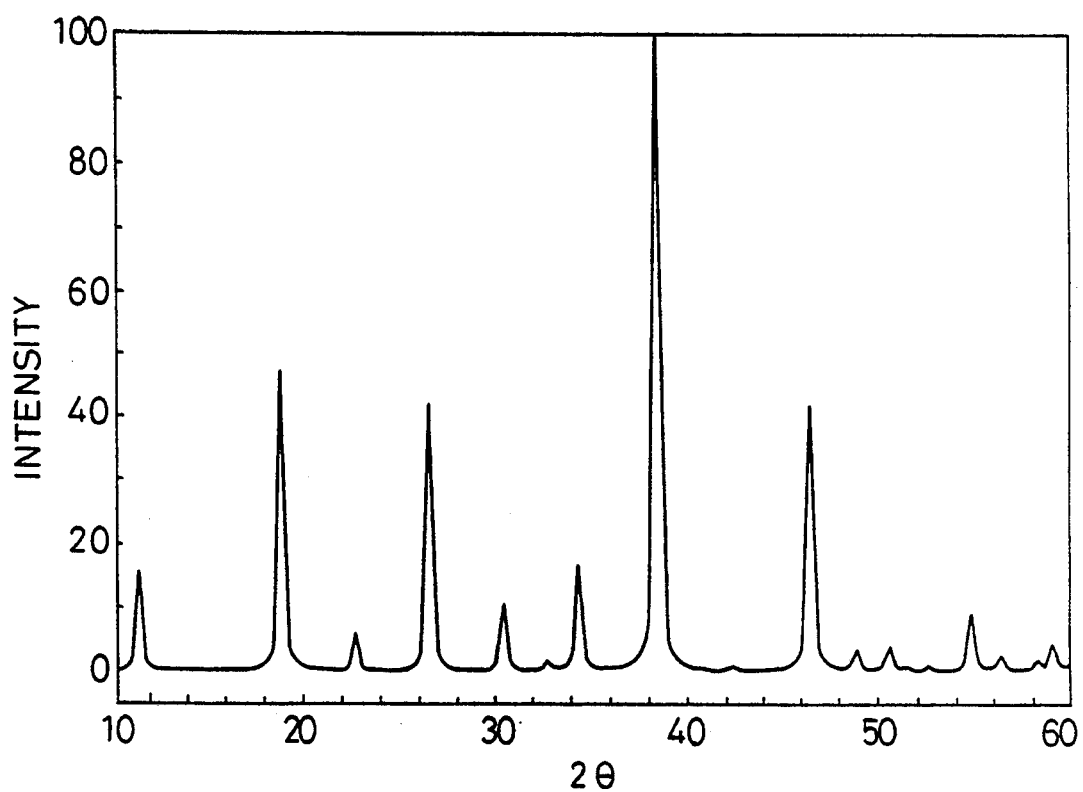
FIG. 22 is an X-ray diffraction pattern diagram of the oxide superconductor of Embodiment 17.
Figure 23:
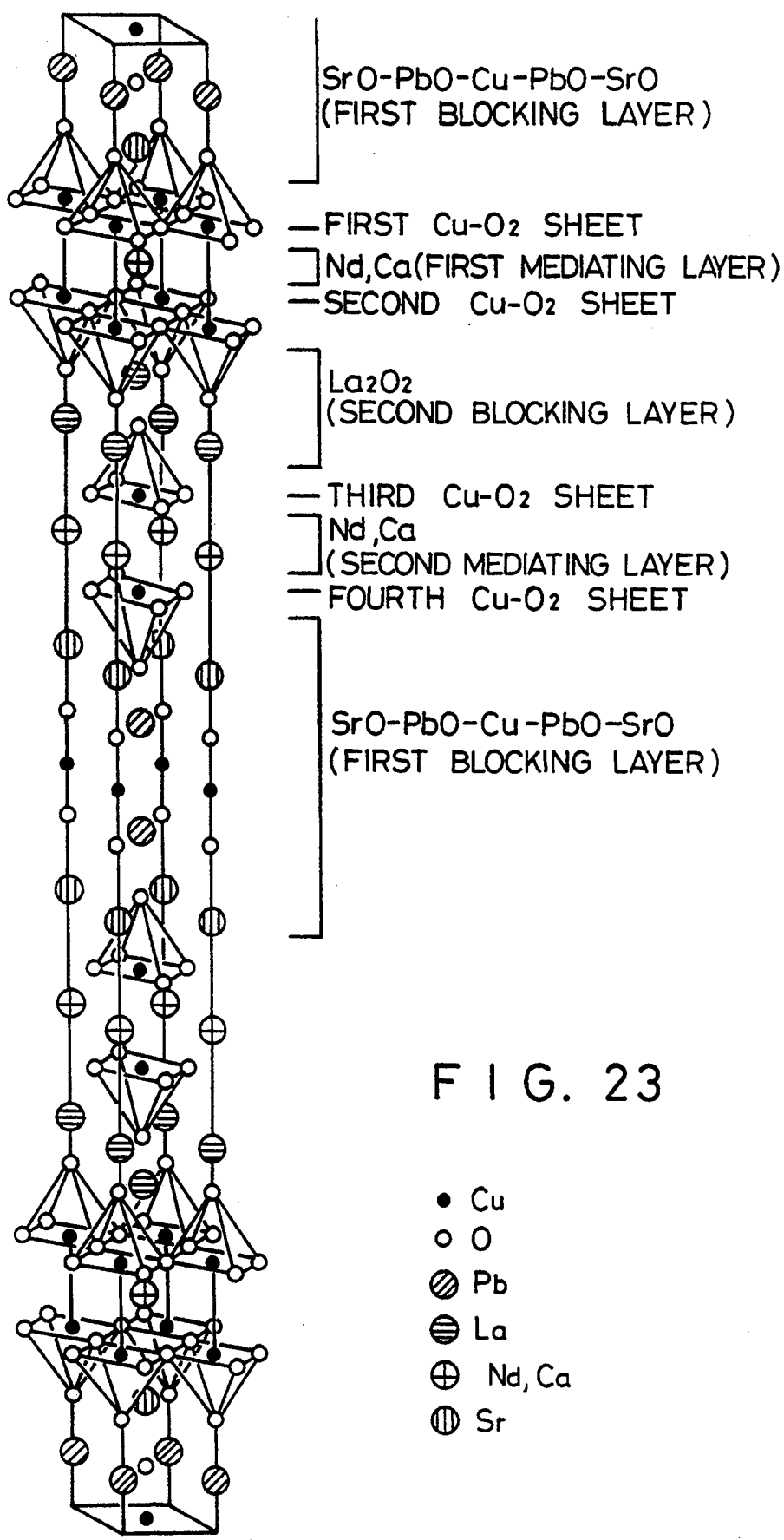
FIG. 23 is a model diagram of a crystal structure (Model 2-11) of Embodiment 18 as a two-layer system oxide superconductor according to the present invention.
Figure 24:
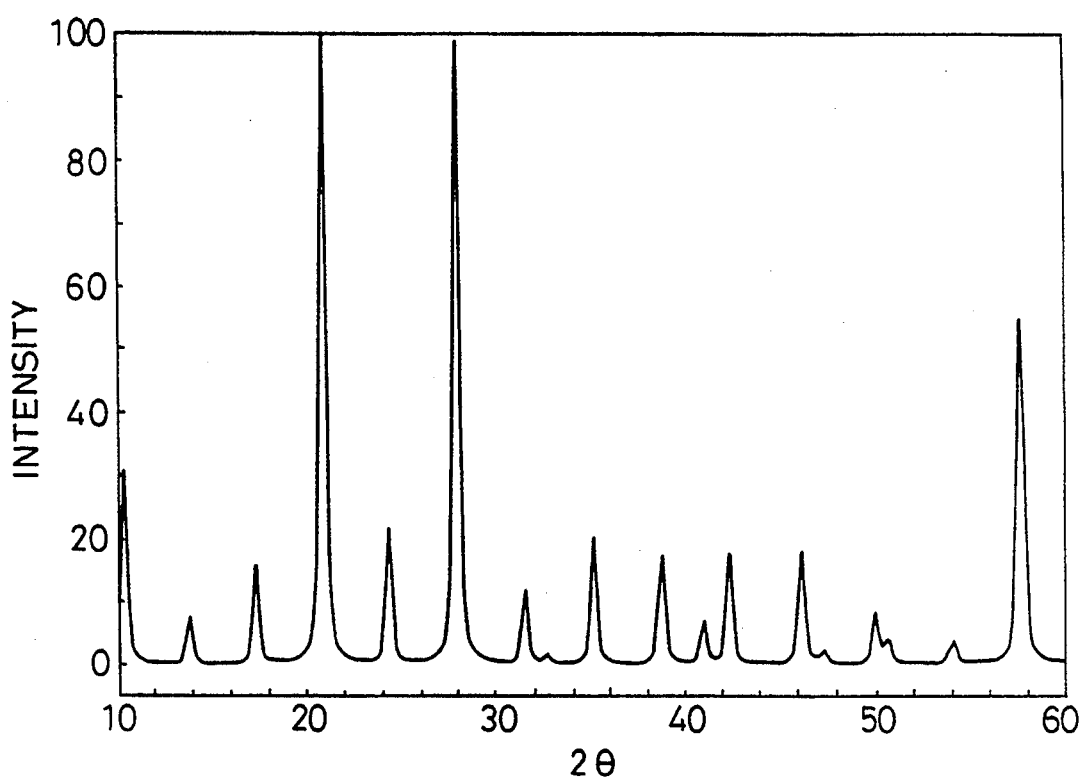
FIG. 24 is an X-ray diffraction pattern diagram of the oxide superconductor of Embodiment 18.

FIGS. 19 to 24 show details of the two-layer systems, in which FIGS. 19 and 20 are a model diagram and an X-ray diffraction pattern, respectively, of Embodiment 15 (Model 2-6), FIGS. 21 and 22 are a model diagram and an X-ray diffraction pattern, respectively, of Embodiment 17 (Model 2-8), and FIGS. 23 and 24 are a model diagram and an X-ray diffraction pattern, respectively, of Embodiment 18 (Model 2-11).

Figure 25:
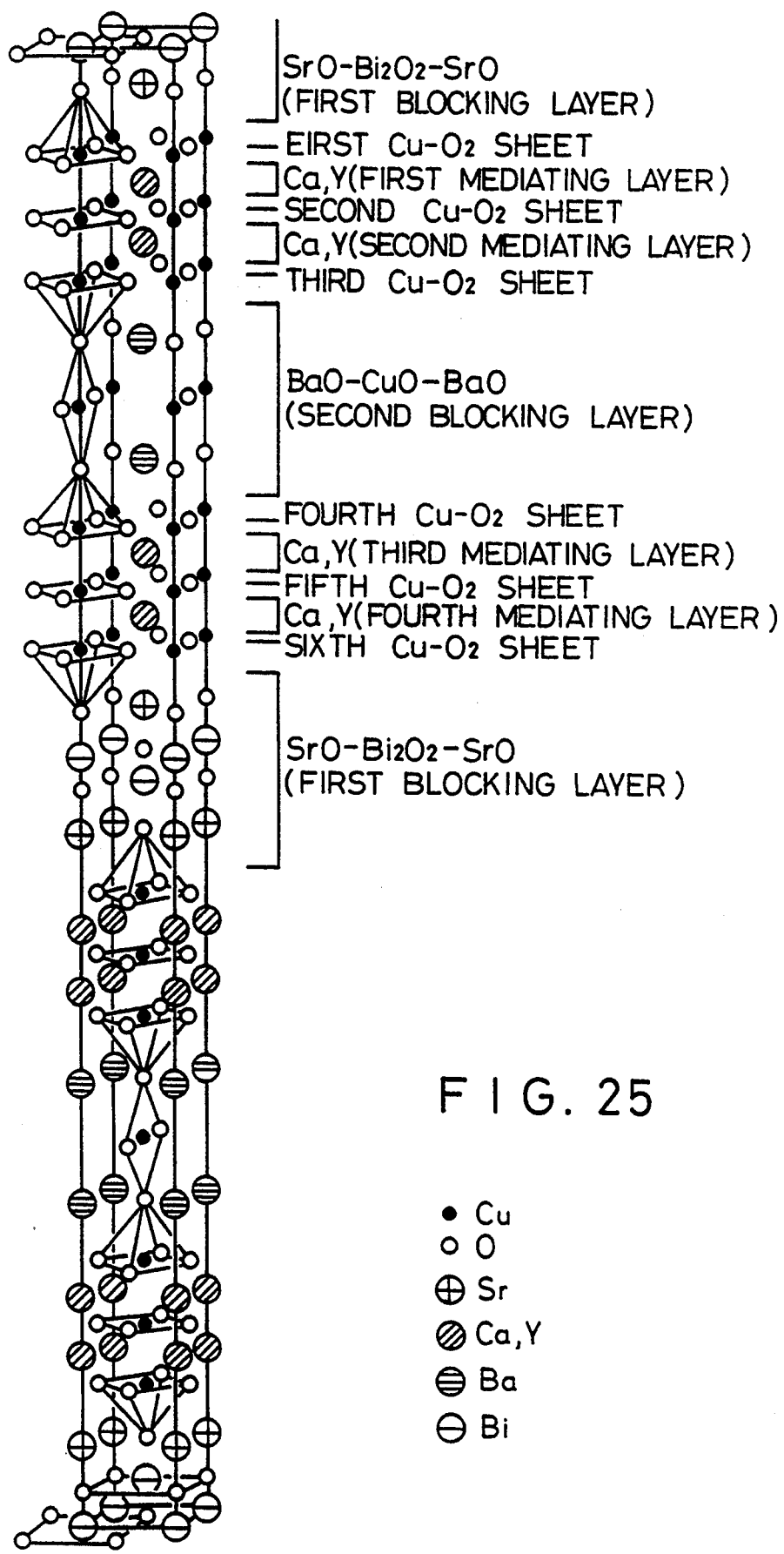
FIG. 25 is a model diagram of a crystal structure (Model 3-5) of Embodiment 27 as a three-layer system oxide superconductor according to the present invention.
Figure 27:
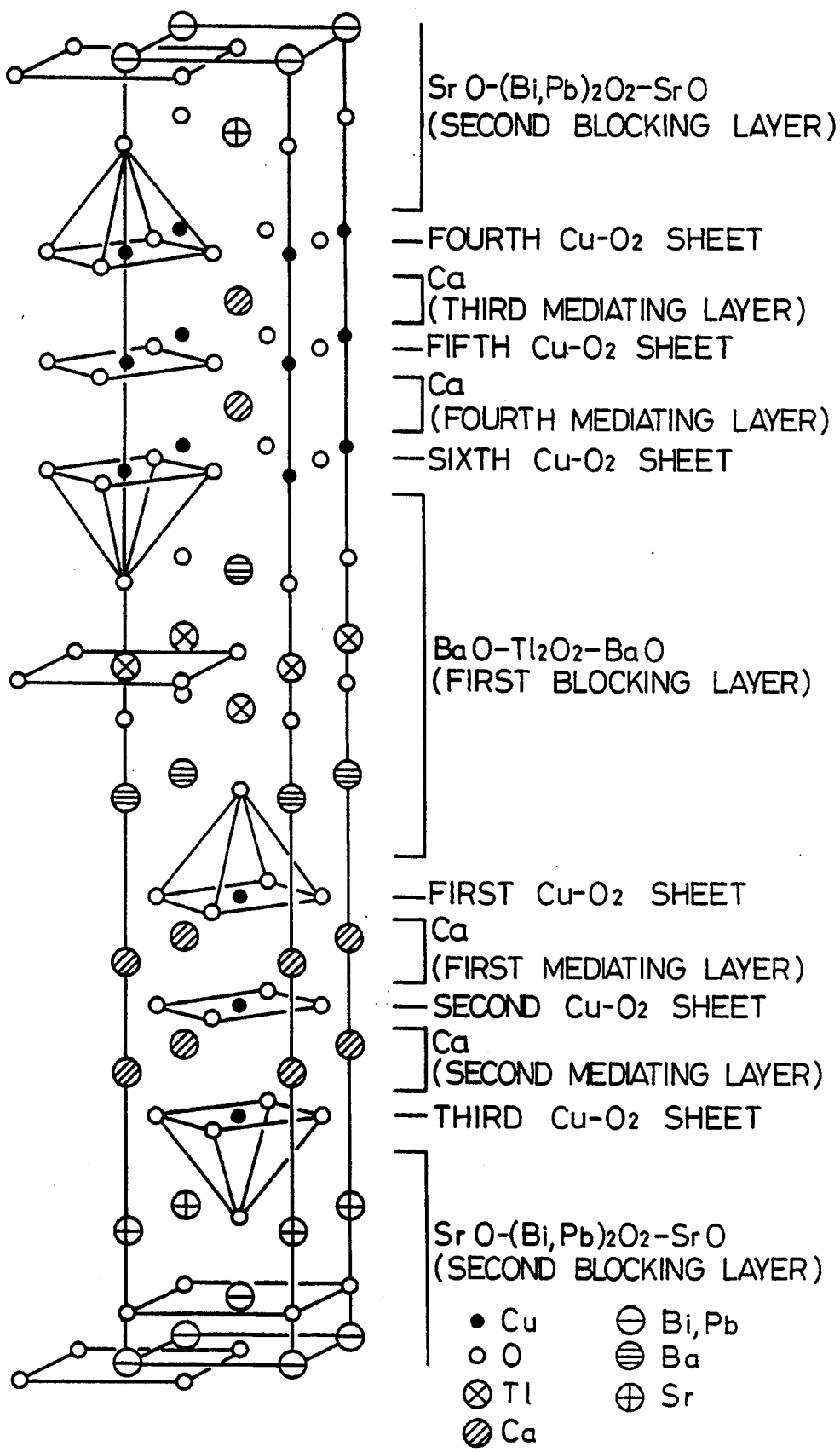
FIG. 27 is a model diagram of a crystal structure (Model 3-10) of Embodiment 30 as a three-layer system oxide superconductor according to the present invention.
Figure 28:
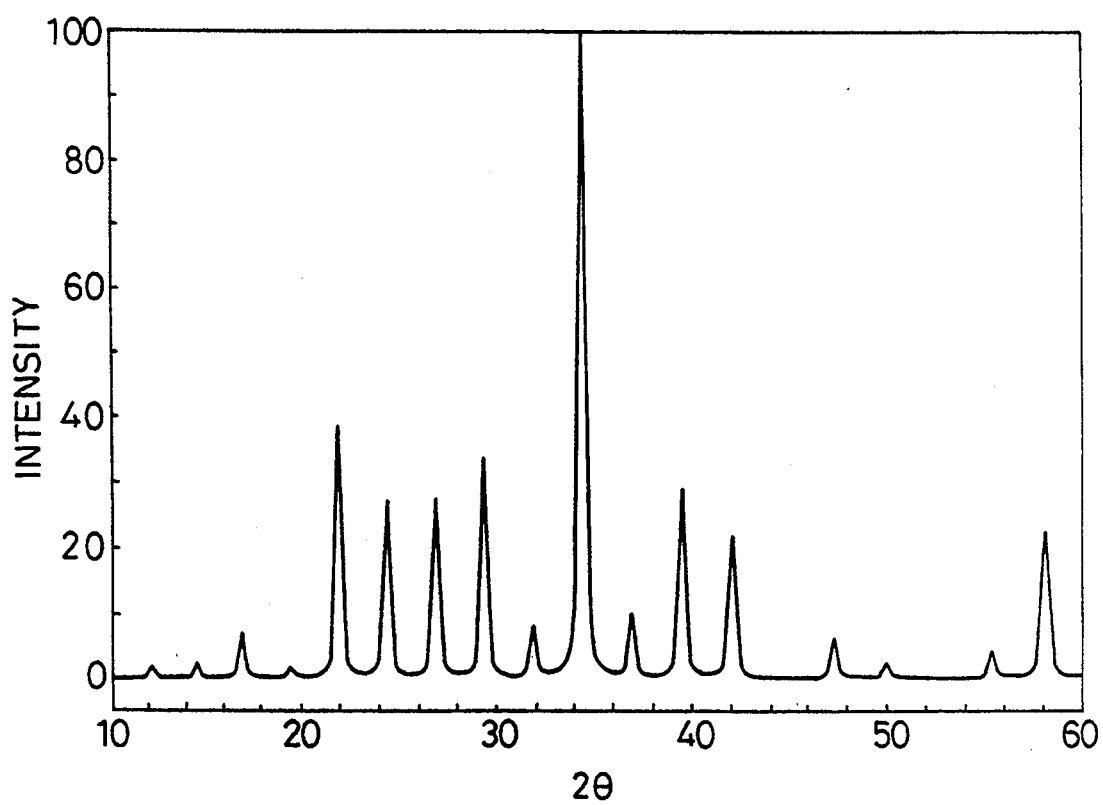
FIG. 28 is an X-ray diffraction pattern diagram of the oxide superconductor of Embodiment 30.
Figure 29:
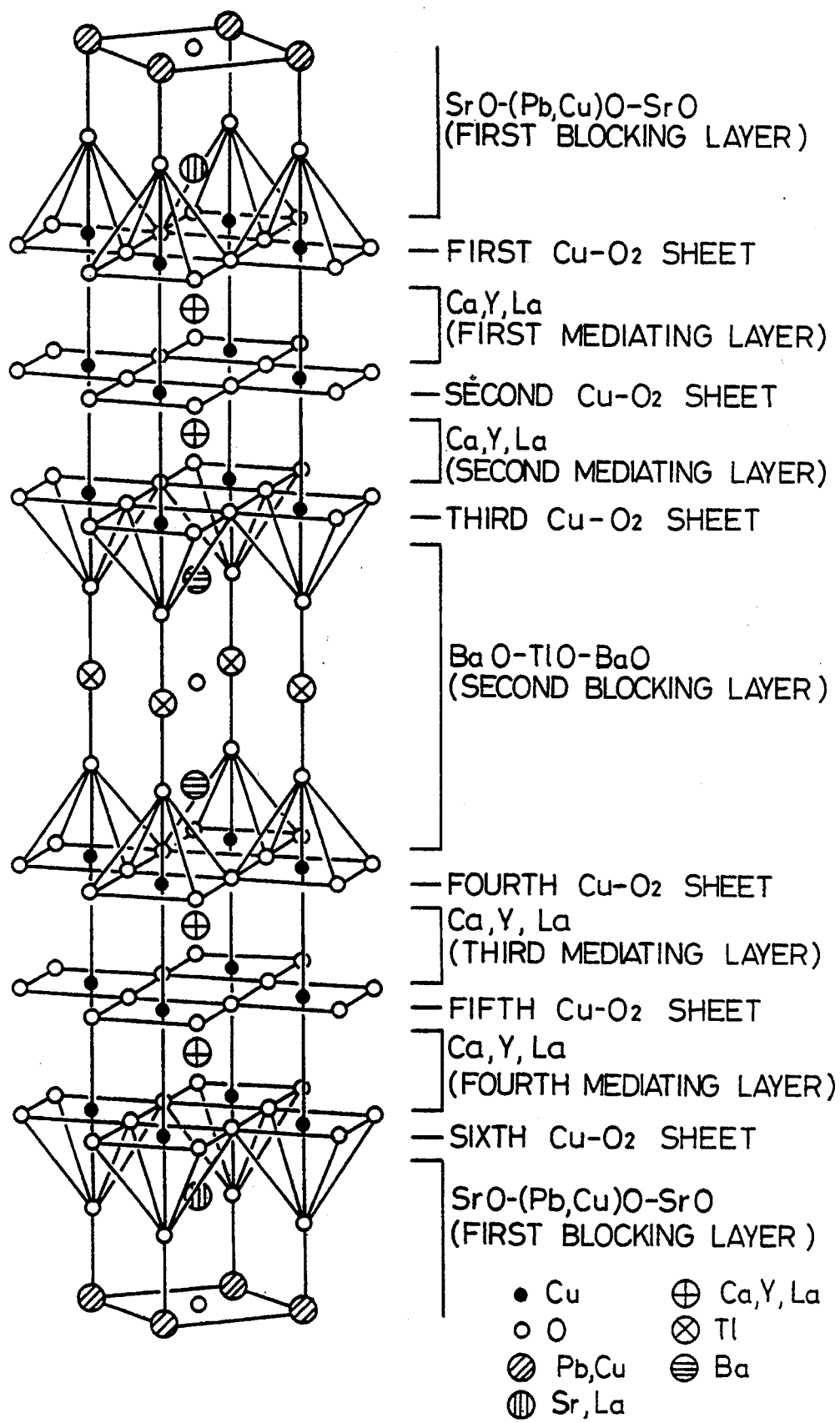
FIG. 29 is a model diagram of a crystal structure (Model 3-20) of Embodiment 32 as a three-layer system oxide superconductor according to the present invention.
Figure 30:
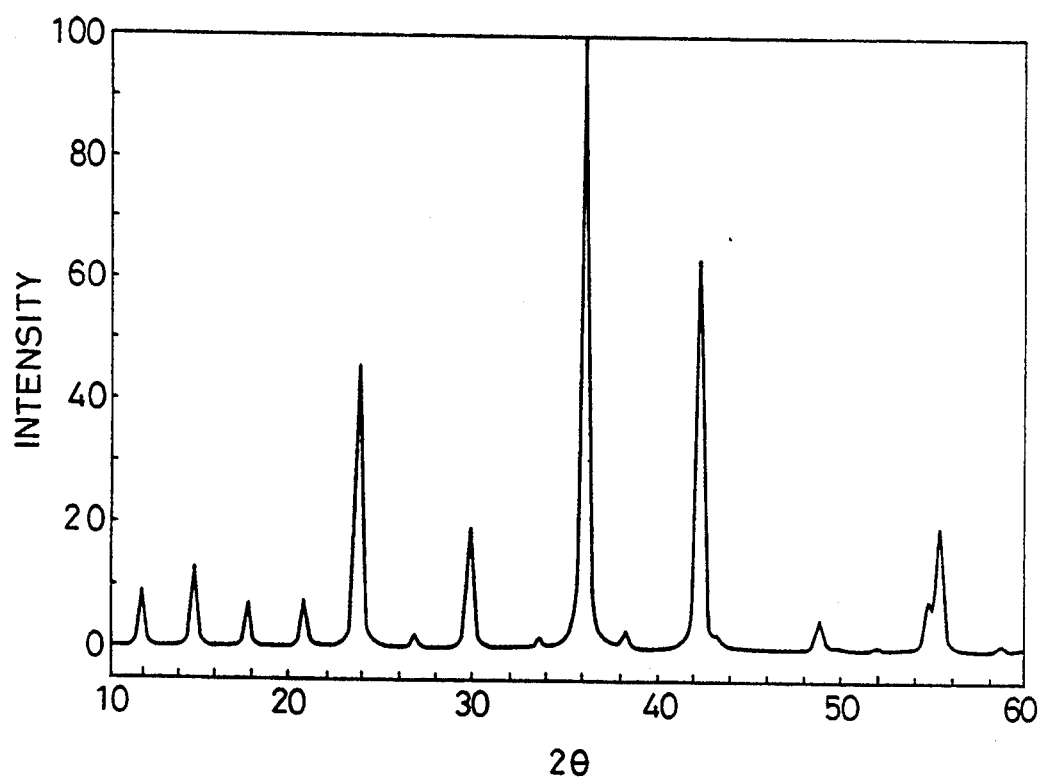
FIG. 30 is an X-ray diffraction pattern diagram of the oxide superconductor of Embodiment 32.

Further, FIGS. 25 to 30 show details of the three-layer systems, in which FIGS. 25 and 26 are a model diagram and an X-ray diffraction pattern, respectively, of Embodiment 27 (Model 3-5), FIGS. 27 and 28 are a model diagram and an X-ray diffraction pattern, respectively, of Embodiment 30 (Model 3-10), and FIGS. 29 and 30 are a model diagram and an X-ray diffraction pattern, respectively, of Embodiment 32 (Model 3-20).

Practically, also in the individual crystal structures shown in these model figures, the oxygen content may be somewhat deviated from its stoichiometric value, due to carrier concentration adjustment, or some cations may be substituted, as mentioned above.

Although only thirty-five kinds of oxide superconductors of the present invention, among seventy-seven kinds in total, have been given as the embodiments, the remaining kinds can be also manufactured by the same method as these embodiments.

Thus, according to the present invention, the approximately twenty kinds of conventionally found copper oxide superconductors can be increased to about seventy-seven kinds by using a combination of two blocking layers of different compositions and one $CuO_2$ sheet, a combination of two blocking layers of different compositions, one mediating layer, and two $Cu-O_2$ sheets, or a combination of two blocking layers of different compositions, two mediating layers, and three $Cu-O_2$ sheets, as has been also described in connection with the embodiments, so that the materials can be applied to a wider variety of fields.

We claim:

1. An oxide superconductor comprising repeated units each including a first blocking layer having a composition selected from the following group, a first $Cu-O_2$ sheet, a second blocking layer having a composition selected from the following group and different from the composition of said first blocking layer, and a second $Cu-O_2$ sheet, arranged in layers in the order named, said group consisting of:

$La_2O_2$,
BaO-CuO-BaO
BaO-CuO-CuO-BaO
$SrO-Bi_2O_2-SrO$,
$BaO-Tl_2O_2-BaO$,
BaO-TlO-BaO,
SrO-PbO-Cu-PbO-SrO,
SrO-(Pb, Cu)O-SrO, and
SrO-(Pb, St) O-SrO.

2. An oxide superconductor comprising repeated units each including a first blocking layer having a composition selected from the following group a, a first $Cu-O_2$ sheet, a first mediating layer consisting of elements selected from the following group b, a second $Cu-O_2$ sheet, a second blocking layer having a composition selected from the following group a and different from the composition of said first blocking layer, a third $Cu-O_2$ sheet, a second mediating layer consisting of elements selected from the following group b, and a fourth $Cu-O_2$ sheet, arranged in layers in the order named, said group a consisting of:
$La_2O_2$,
BaO-CuO- BaO,
$SrO-Bi_2O_2-SrO$,
$BaO-Tl_2O_2-BaO$,
$BaO-Tl_2O_2-BaO$,
SrO-PbO-Cu-PbO-SrO,
SrO-(Pb, Cu)O-SrO,
SrO-(Pb, Sr)O-SrO, and
$Ln_2O_2$ (where Ln is selected from Nd, Sm, Eu and Gd),
said group b consisting of:
Ca, Y, Nd, Sm, Eu, Gd, Dy, Ho, Er, Tm and Yb 3. An oxide superconducting material comprising repeated units each including a first blocking layer having a composition selected from the following group a, a first $Cu-O_2$ sheet, a first mediating layer consisting elements selected from the following group b, a second $Cu-O_2$ sheet, a second mediating layer consisting of elements selected from the following group b, a third $Cu-O_2$ sheet, a second blocking layer having a composition selected from the following group a and different from the composition of said first blocking layer, a fourth $Cu-O_2$ sheet, a third mediating layer consisting of elements selected from the following group b, a fifth $CuO_2$ sheet, a fourth mediating layer consisting of elements selected from the following group b, and a sixth $Cu-O_2$ sheet, arranged in layers in the order named, said group a consisting of:
$La_2O_2$,
BaO-CuO-BaO,
BaO-CuO-CuO-BaO,
$SrO-Bi_2O_2-SrO$,
$BaO-Tl_2O_2-BaO$,
BaO-TlO-BaO,
SrO-PbO-Cu-PbO-SrO,
SrO-(Pb, Cu)O-SrO,
SrO-(Pb, Sr)O-Sr, and
$Ln_2O_2$ (where Ln is selected from Nd, Sm, Eu and Gd), said group b consisting of:
Ca, Sr, Y, Nd, Sm, Eu, Gd, Dy, Ho, Er, Tm, Yb and Lu.

4. An oxide superconductor comprising repeated units each including a first blocking layer having a composition selected from the following group a, a first $Cu-O_2$ sheet, a first mediating layer consisting of elements selected from the following group b, a second $Cu-O_2$ sheet, a second blocking layer having a composition selected from the following group a and different from the composition of said first blocking layer, a third $Cu-O_2$ sheet, a second mediating layer consisting of elements selected from the following group b and a fourth $Cu-O_2$ sheet, arranged in layers in the order named, said group a consisting of:
$La_2O_2$,
BaO-CuO-BaO,
BaO-CuO-CuO-BaO,
$SrO-Bi_2O_2-SrO$,
$BaO-Tl_2O_2-BaO$,
BaO-TlO-BaO,
SrO-PbO-Cu-PbO-SrO,
SrO-(Pb, Cu)O-SrO,
SrO-(Pb, Sr)O-SrO, and
$Ln_2O_2$ (where Ln is selected from Nd, Sm, Eu and Gd),
said group b consisting of:
Sr and Lu.

5. An oxide superconductor comprising repeated units each including a first blocking layer having a composition selected from the following group a, a first $Cu-O_2$ sheet, a first mediating layer consisting of elements selected from the following group b, a second $Cu-O_2$ sheet, a second blocking layer having a composition selected from the following group a and different from the composition of said first blocking layer, a third $Cu-O_2$ sheet, a second mediating layer consisting of elements selected from the following group b, and a fourth $Cu-O_2$ sheet, arranged in layers in the order named, said group a consisting of:
$La_2O_2$,
BaO-CuO-CuO-BaO,
$SrO-Bi_2O_2-SrO$,
$BaO-Tl_2O_2-BaO$,
BaO-TlO-BaO,
SrO-PbO-Cu-PbO-SrO,
SrO-(Pb, Cu)O-SrO,
SrO-(Pb, Sr)O-SrO, and
$Ln_2O_2$ (where Ln is selected from Nd, Sm, Eu and Gd),
said group b consisting of:
Ca, Y, Nd, Sm, Eu, Gd, Dy, Ho, Er, Tm and Yb.

* * * * *